United States Patent
Ohue

(10) Patent No.: US 11,402,713 B2
(45) Date of Patent: Aug. 2, 2022

(54) DISPLAY DEVICE

(71) Applicant: JAPAN DISPLAY INC., Tokyo (JP)

(72) Inventor: Yoshihide Ohue, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/484,606

(22) Filed: Sep. 24, 2021

(65) Prior Publication Data

US 2022/0011639 A1    Jan. 13, 2022

Related U.S. Application Data

(63) Continuation of application No. PCT/JP2020/010109, filed on Mar. 9, 2020.

(30) Foreign Application Priority Data

Mar. 26, 2019  (JP) .............................. JP2019-059314

(51) Int. Cl.
  *G02F 1/1362*   (2006.01)
  *G02F 1/1333*   (2006.01)
  (Continued)

(52) U.S. Cl.
  CPC ...... *G02F 1/136286* (2013.01); *G02F 1/1334* (2013.01); *G02F 1/1368* (2013.01);
  (Continued)

(58) Field of Classification Search
  CPC ............. G02F 1/1333; G02F 1/133345; G02F 1/1334; G02F 1/1335; G02F 1/133512;
  (Continued)

(56) References Cited

U.S. PATENT DOCUMENTS

2004/0174483 A1   9/2004   Nakamura et al.
2006/0187397 A1   8/2006   Nakamura et al.
(Continued)

FOREIGN PATENT DOCUMENTS

JP    2004341185 A    2/2004
JP    2010123909 A    6/2010
(Continued)

OTHER PUBLICATIONS

International Search Report in Application No. PCT/JP2020/010109, dated Jun. 2, 2020.

*Primary Examiner* — Thoi V Duong
(74) *Attorney, Agent, or Firm* — K&L Gates LLP

(57) ABSTRACT

A display device includes: an array substrate; a counter substrate; a liquid crystal layer; and a light source. The array substrate includes: signal lines arranged in a first direction; scanning lines arranged in a second direction; switching elements coupled to the scanning lines and the signal lines; an organic insulating layer covering at least the switching elements; and a metal layer overlapping the organic insulating layer. A region surrounded by the scanning lines and the signal lines has a region having a thickness less than that of the organic insulating layer. The metal layer covers a first slant surface of the organic insulating layer on a side of the organic insulating layer closer to the light source than the switching element is, and a second slant surface of the organic insulating layer on a side of the organic insulating layer farther from the light source than the switching element is.

10 Claims, 20 Drawing Sheets

(51) Int. Cl.
  *G02F 1/1343* (2006.01)
  *G02F 1/1334* (2006.01)
  *G02F 1/13357* (2006.01)
  *G02F 1/1368* (2006.01)
  *G02F 1/1335* (2006.01)

(52) U.S. Cl.
  CPC .... *G02F 1/13439* (2013.01); *G02F 1/133345* (2013.01); *G02F 1/133615* (2013.01); *G02F 1/136209* (2013.01); *G02F 1/133616* (2021.01)

(58) Field of Classification Search
  CPC ............ G02F 1/133524; G02F 1/1336; G02F 1/133615; G02F 1/1343; G02F 1/134309; G02F 1/13439; G02F 1/1362; G02F 1/136209; G02F 1/136213; G02F 1/133616; G02F 1/136227; G02F 1/136286; G02F 1/1368; G02F 1/13685; G02F 2203/03; G09G 3/00; G09F 9/00; H01L 29/786
  See application file for complete search history.

(56) References Cited

U.S. PATENT DOCUMENTS

| | | | |
|---|---|---|---|
| 2012/0139000 A1* | 6/2012 | Lee | H01L 27/1255 438/23 |
| 2017/0115525 A1 | 4/2017 | Okita | |
| 2018/0031758 A1* | 2/2018 | Mizuno | G02B 6/0055 |
| 2018/0211611 A1 | 7/2018 | Kato | |
| 2020/0150490 A1 | 5/2020 | Mizuno et al. | |
| 2021/0116759 A1 | 4/2021 | Mizuno et al. | |

FOREIGN PATENT DOCUMENTS

| | | |
|---|---|---|
| JP | 201783614 A | 5/2017 |
| JP | 2018021974 A | 2/2018 |
| JP | 2018120021 A | 8/2018 |

* cited by examiner

DISPLAY DEVICE

CROSS-REFERENCE TO RELATED APPLICATION

This application claims the benefit of priority from Japanese Patent Application No. 2019-059314 filed on Mar. 26, 2019 and International Patent Application No. PCT/JP2020/010109 filed on Mar. 9, 2020, the entire contents of which are incorporated herein by reference.

BACKGROUND

1. Technical Field

What is disclosed herein relates to a display device.

2. Description of the Related Art

Japanese Patent Application Laid-open Publication No. 2018-021974 (JP-A-2018-021974) describes a display device including a first light-transmitting substrate, a second light-transmitting substrate disposed so as to be opposed to the first light-transmitting substrate, a liquid crystal layer including polymer-dispersed liquid crystals filled between the first light-transmitting substrate and the second light-transmitting substrate, and at least one light emitter disposed so as to be opposed to at least one of side surfaces of the first light-transmitting substrate and the second light-transmitting substrate.

In the display device described in JP-A-2018-021974, when viewed from one surface side of a display panel, a background on the other surface side opposite to the one surface side is visible. Since the light source is disposed so as to be opposed to at least one of the side surfaces of the first light-transmitting substrate and the second light-transmitting substrate, light leakage of a switching element by the light source needs to be reduced.

For the foregoing reasons, there is a need for a display device that allows an image displayed using a light source to be viewed from one surface side of a display panel together with a background on the other surface side opposite to the one surface, and that can reduce light leakage of a switching element.

SUMMARY

According to an aspect, a display device includes: an array substrate; a counter substrate; a liquid crystal layer between the array substrate and the counter substrate; and a light source disposed so as to emit light to a side surface of the array substrate or a side surface of the counter substrate. The array substrate includes: a plurality of signal lines arranged with spaces in a first direction; a plurality of scanning lines arranged with spaces in a second direction; switching elements coupled to the scanning lines and the signal lines; an organic insulating layer that covers at least the switching elements; and a metal layer provided above the organic insulating layer so as to overlap the organic insulating layer. Each of regions surrounded by the scanning lines and the signal lines has a region having a thickness less than that of the organic insulating layer overlapping the scanning lines and the signal lines in a plan view. The metal layer covers a first slant surface of the organic insulating layer, the firsts slant surface being located on a side of the organic insulating layer closer to the light source than the switching element is. The metal layer covers a second slant surface of the organic insulating layer, the second slant surface being located on a side of the organic insulating layer farther from the light source than the switching element is.

DETAILED DESCRIPTION

Figure 1:
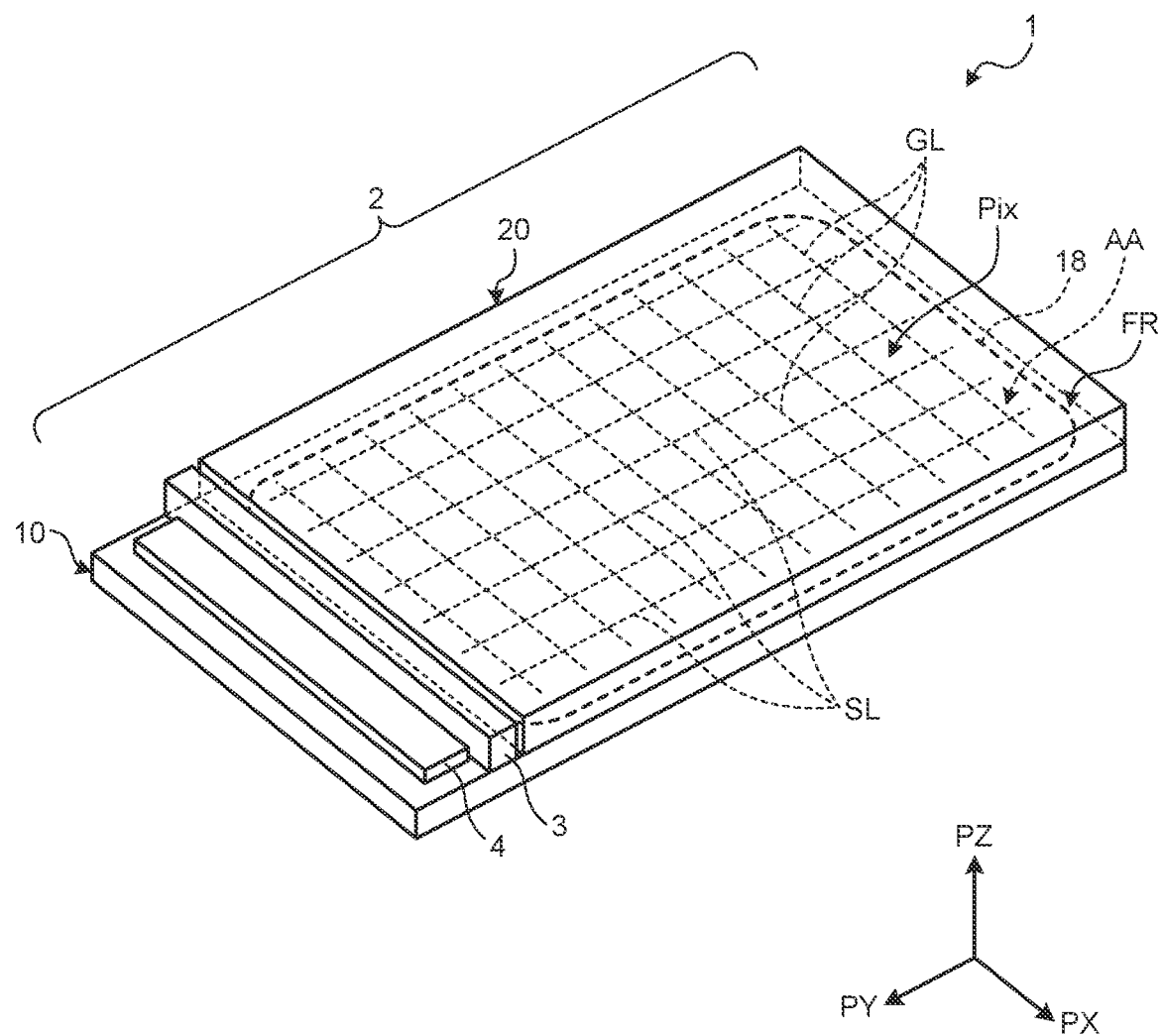
FIG. 1 is a perspective view illustrating an example of a display device according to an embodiment.

The following describes forms (embodiments) for carrying out the present disclosure in detail with reference to the drawings. The present disclosure is not limited to the description of the embodiments given below. Components described below include those easily conceivable by those skilled in the art or those substantially identical thereto. Moreover, the components described below can be appropriately combined. What is disclosed herein is merely an example, and the present disclosure naturally encompasses appropriate modifications easily conceivable by those skilled in the art while maintaining the gist of the disclosure. To further clarify the description, widths, thicknesses, shapes, and the like of various parts are schematically illustrated in the drawings as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

In this disclosure, when an element is described as being "on" another element, the element can be directly on the other element, or there can be one or more elements between the element and the other element.

First Embodiment

Figure 2:
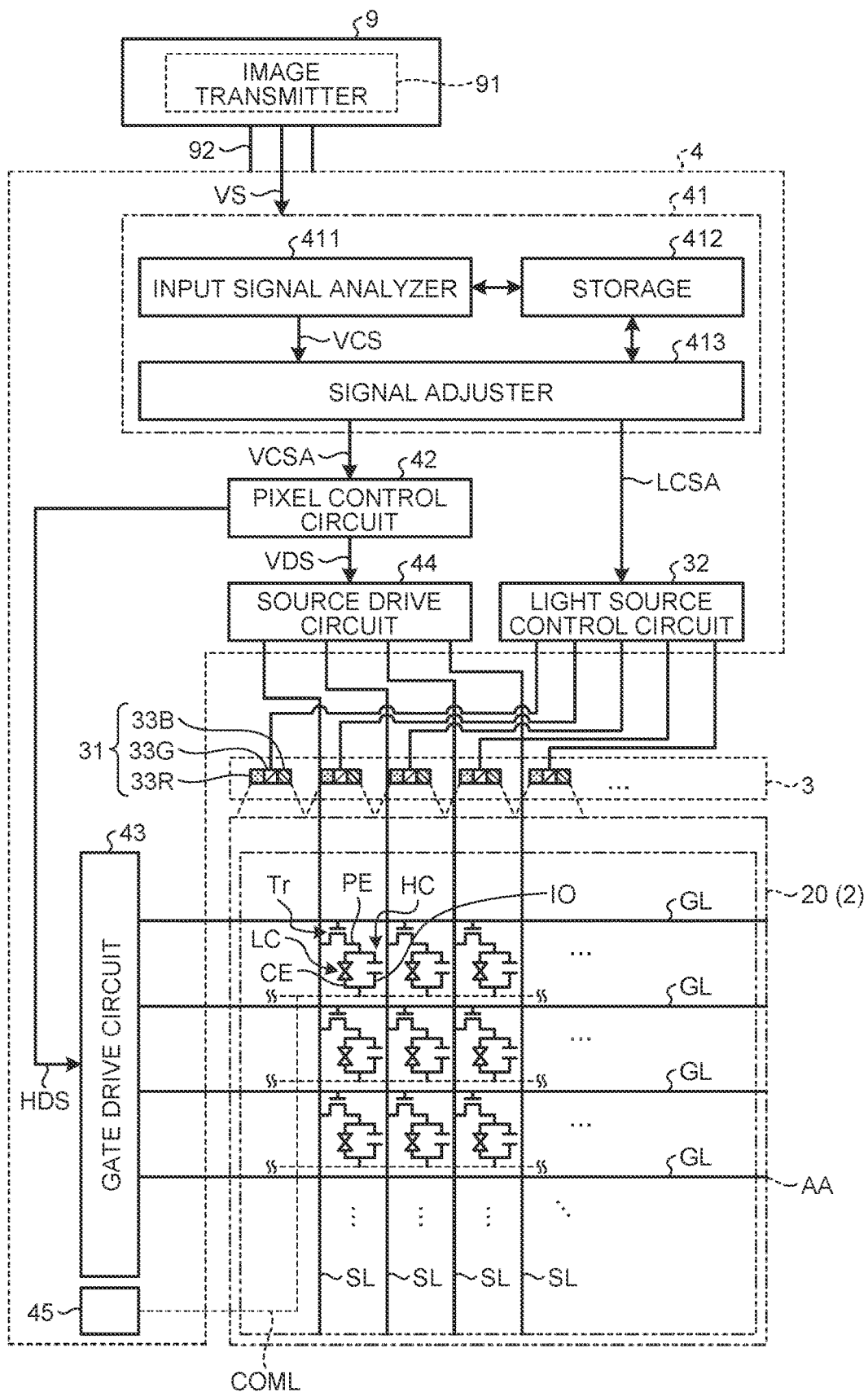
FIG. 2 is a block diagram illustrating the display device according to a first embodiment.
Figure 3:
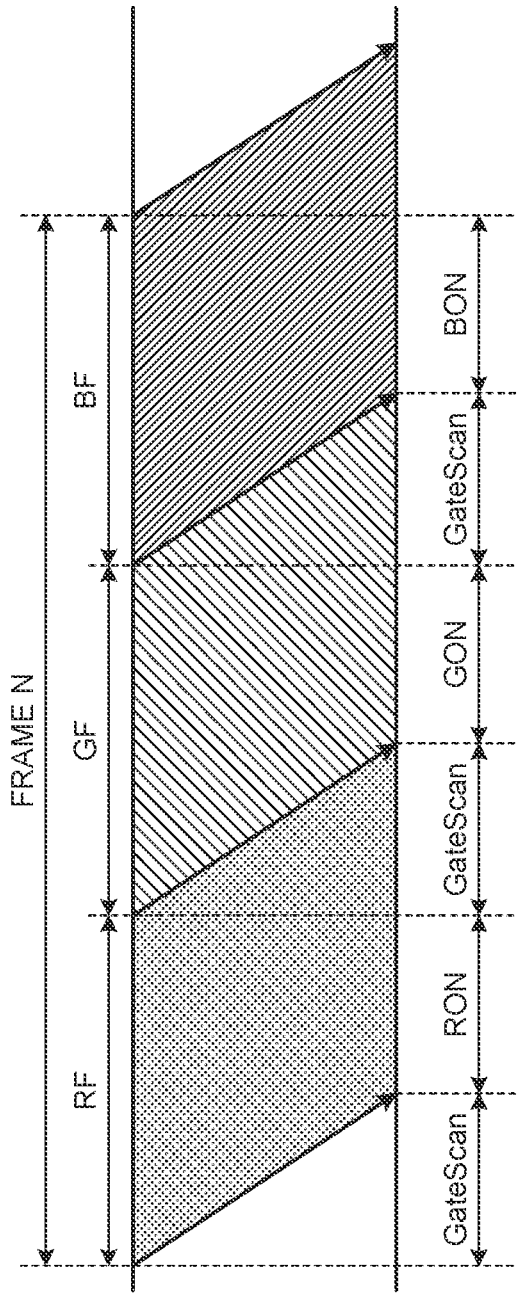
FIG. 3 is a timing diagram explaining timing of light emission by a light source in a field-sequential system according to the first embodiment.

FIG. 1 is a perspective view illustrating an example of a display device according to the present embodiment. FIG. 2 is a block diagram illustrating the display device of FIG. 1. FIG. 3 is a timing diagram explaining timing of light emission by a light source in a field-sequential system.

As illustrated in FIG. 1, a display device 1 includes a display panel 2, a light source 3, and a drive circuit 4. A PX direction denotes one direction on the plane of the display panel 2. A second direction PY denotes a direction orthogonal to the PX direction. A third direction PZ denotes a direction orthogonal to a PX-PY plane.

Figure 5:
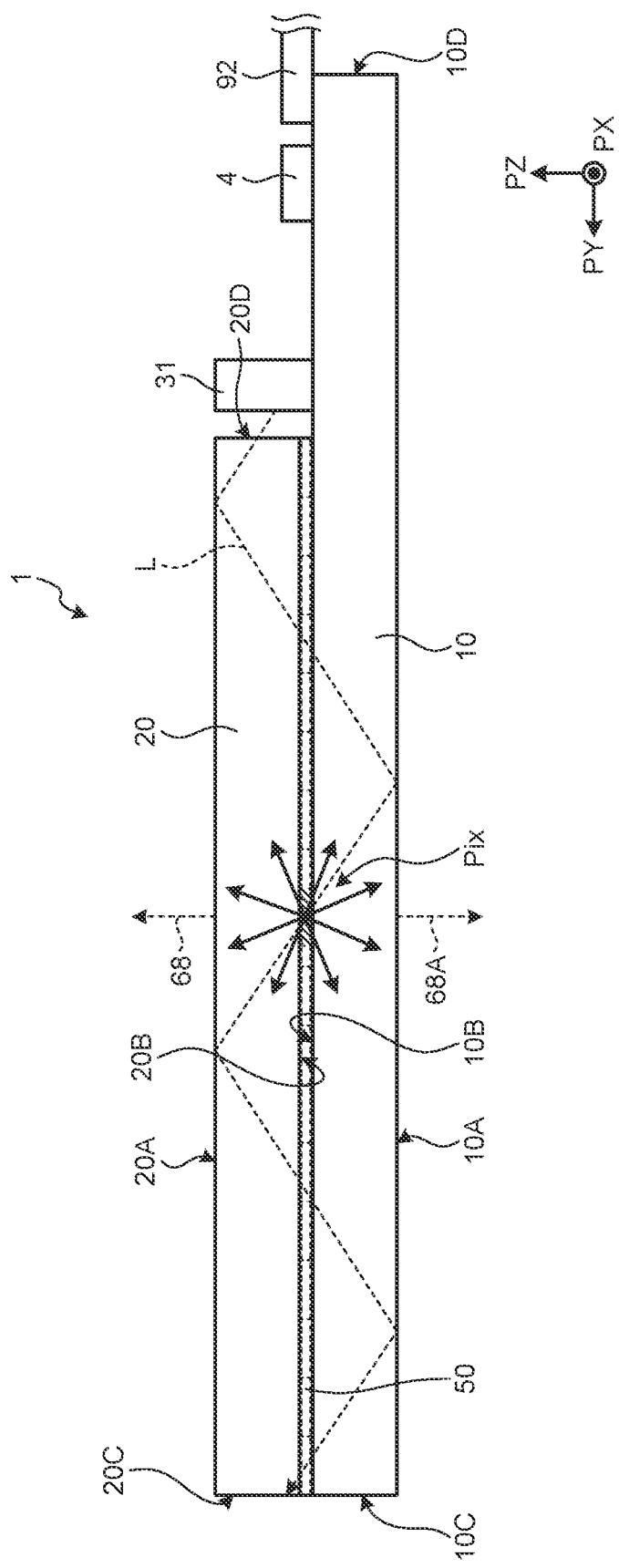
FIG. 5 is a sectional view illustrating an exemplary section of the display device of FIG. 1.

The display panel 2 includes an array substrate 10, a counter substrate 20, and a liquid crystal layer 50 (refer to FIG. 5). The counter substrate 20 is opposed to a surface of the array substrate 10 in a direction orthogonal thereto (in the PZ direction in FIG. 1). Polymer dispersed liquid crystals LC (to be described later) are sealed in the liquid crystal layer 50 (refer to FIG. 5) by the array substrate 10, the counter substrate 20, and a sealing part 18.

As illustrated in FIG. 1, the display panel 2 has a display region AA capable of displaying images and a peripheral region FR outside the display region AA. A plurality of pixels Pix are arranged in a matrix having a row-column configuration in the display region AA. In the present disclosure, a row refers to a pixel row including m pixels Pix arranged in one direction, and a column refers to a pixel column including n pixels Pix arranged in a direction orthogonal to the direction in which the rows extend. The values of m and n are defined depending on a display resolution in the vertical direction and a display resolution in the horizontal direction. A plurality of scanning lines GL are provided corresponding to the rows, and a plurality of signal lines SL are provided corresponding to the columns.

The light source 3 includes a plurality of light emitters 31. As illustrated in FIG. 2, a light source controller (light source control circuit) 32 is included in the drive circuit 4. The light source controller 32 may be a circuit separate from the drive circuit 4. The light emitters 31 are electrically coupled to the light source controller 32 through wiring in the array substrate 10.

As illustrated in FIG. 1, the drive circuit 4 is fixed to the surface of the array substrate 10. As illustrated in FIG. 2, the drive circuit 4 includes a signal processing circuit 41, a pixel control circuit 42, a gate drive circuit 43, a source drive circuit 44, and a common potential drive circuit 45. The array substrate 10 has an area larger than that of the counter substrate 20 in a PX-PY plane, and the drive circuit 4 is provided on a projecting portion of the array substrate 10 exposed from the counter substrate 20.

The signal processing circuit 41 receives an input signal (such as a red-green-blue (RGB) signal) VS from an image transmitter 91 of an external host controller 9 through a flexible substrate 92.

The signal processing circuit 41 includes an input signal analyzer 411, a storage 412, and a signal adjuster 413. The input signal analyzer 411 generates a second input signal VCS based on an externally received first input signal VS.

The second input signal VCS is a signal for determining a gradation value to be given to each of the pixels Pix of the display panel 2 based on the first input signal VS. In other words, the second input signal VCS is a signal including gradation information on the gradation value of each of the pixels Pix.

The signal adjuster 413 generates a third input signal VCSA from the second input signal VCS. The signal adjuster 413 transmits the third input signal VCSA to the pixel control circuit 42, and transmits a light source control signal LCSA to the light source controller 32. The light source control signal LCSA is a signal including information on light quantities of the light emitters 31 set in accordance with, for example, input gradation values given to the pixels Pix. For example, the light quantities of the light emitters 31 are set smaller when a darker image is displayed, and set larger when a brighter image is displayed.

The pixel control circuit 42 generates a horizontal drive signal HDS and a vertical drive signal VDS based on the third input signal VCSA. In the present embodiment, since the display device 1 is driven by the field-sequential system, the horizontal drive signal HDS and the vertical drive signal VDS are generated for each color emittable by the light emitter 31.

The gate drive circuit 43 sequentially selects the scanning lines GL of the display panel 2 based on the horizontal drive signal HDS during one vertical scanning period. The scanning lines GL can be selected in any order.

The source drive circuit 44 supplies a gradation signal depending on the output gradation value of each of the pixels Pix to a corresponding one of the signal lines SL of the display panel 2 based on the vertical drive signal VDS during one horizontal scanning period.

In the present embodiment, the display panel 2 is an active-matrix panel. Hence, the display panel 2 includes the signal (source) lines SL extending in the second direction PY and the scanning (gate) lines GL extending in the first direction PX in a plan view, and includes switching elements Tr at intersecting portions between the signal lines SL and the scanning lines GL.

A thin-film transistor is used as each of the switching elements Tr. A bottom-gate transistor or a top-gate transistor may be used as an example of the thin-film transistor. Although a single-gate thin film transistor is exemplified as the switching element Tr, the switching element Tr may be a double-gate transistor. One of the source electrode and the drain electrode of the switching element Tr is coupled to a corresponding one of the signal lines SL, and the gate electrode of the switching element Tr is coupled to a corresponding one of the scanning lines GL. The other of the source electrode and the drain electrode is coupled to one end of a capacitance (to be described later) of each of the polymer-dispersed liquid crystals LC. The capacitance of the polymer-dispersed liquid crystal LC is coupled at one end thereof to the switching element Tr through a pixel electrode PE, and coupled at the other end thereof to common potential wiring COML through a common electrode CE. A holding capacitance HC is formed between the pixel electrode PE and a holding capacitance electrode IO electrically coupled to the common potential wiring COML. A potential of the common potential wiring COML is supplied by the common potential drive circuit 45.

Each of the light emitters 31 includes a light emitter 33R of a first color (such as red), a light emitter 33G of a second color (such as green), and a light emitter 33B of a third color (such as blue). The light source controller 32 controls the light emitter 33R of the first color, the light emitter 33G of the second color, and the light emitter 33B of the third color so as to emit light in a time-division manner based on the light source control signal LCSA. In this manner, the light emitter 33R of the first color, the light emitter 33G of the second color, and the light emitter 33B of the third color are driven based on the field-sequential system.

As illustrated in FIG. 3, in a first sub-frame (first predetermined time) RF, the light emitter 33R of the first color emits light during a first color light emission period RON, and the pixels Pix selected during one vertical scanning period GateScan scatter light to perform display. On the entire display panel 2, if the gradation signal corresponding to the output gradation value of each of the pixels Pix selected during the one vertical scanning period GateScan is supplied to a corresponding one of the above-described signal lines SL, only the first color is lit up during the first color light emission period RON.

Then, in a second sub-frame (second predetermined time) GF, the light emitter 33G of the second color emits light during a second color light emission period GON, and the pixels Pix selected during the one vertical scanning period GateScan scatter light to perform display. On the entire display panel 2, if the gradation signal corresponding to the output gradation value of each of the pixels Pix selected during the one vertical scanning period GateScan is supplied to a corresponding one of the above-described signal lines SL, only the second color is lit up during the second color light emission period GON.

Further, in a third sub-frame (third predetermined time) BF, the light emitter 33B of the third color emits light during a third color light emission period BON, and the pixels Pix selected during the one vertical scanning period GateScan scatter light to perform display. On the entire display panel 2, if the gradation signal corresponding to the output gradation value of each of the pixels Pix selected during the one vertical scanning period GateScan is supplied to a corresponding one of the above-described signal lines SL, only the third color is lit up during the third color light emission period BON.

Since a human eye has limited temporal resolving power and produces an afterimage, an image with a combination of three colors is recognized in a period of one frame (1F). The field-sequential system can eliminate the need for a color filter, and thus can reduce an absorption loss by the color filter. As a result, higher transmittance can be obtained. In the color filter system, one pixel is made up of sub-pixels obtained by dividing each of the pixels Pix into the sub-pixels of the first color, the second color, and the third color. In contrast, in the field-sequential system, the pixel need not be divided into the sub-pixels in such a manner. A fourth sub-frame may be further included to emit light in a fourth color different from any one of the first color, the second color, and the third color.

Figure 4:
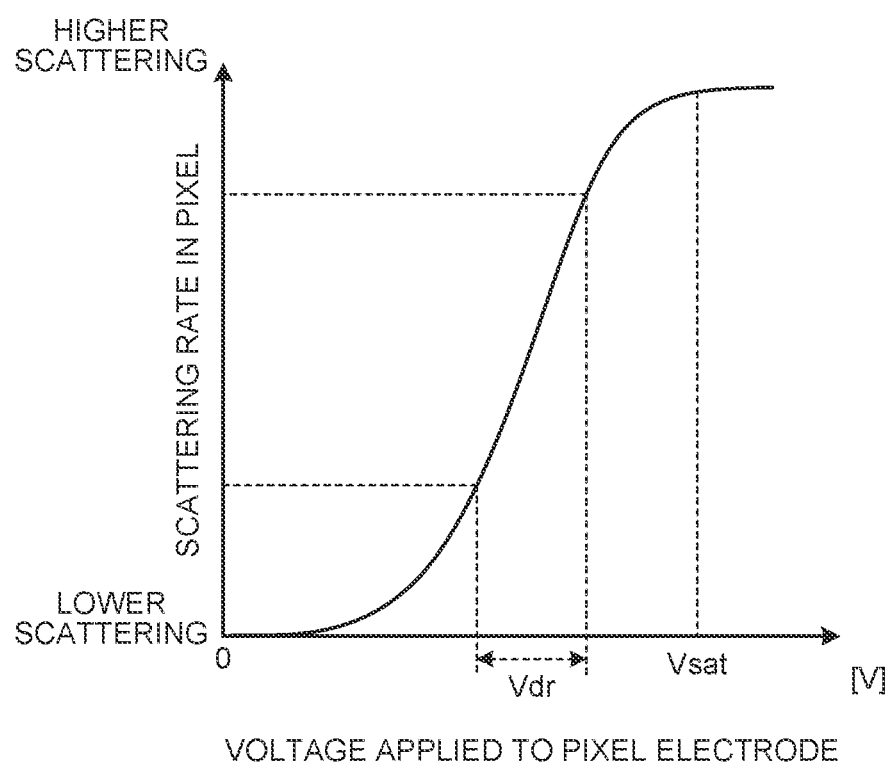
FIG. 4 is an explanatory diagram illustrating a relation between a voltage applied to a pixel electrode and a scattering state of a pixel.
Figure 6:
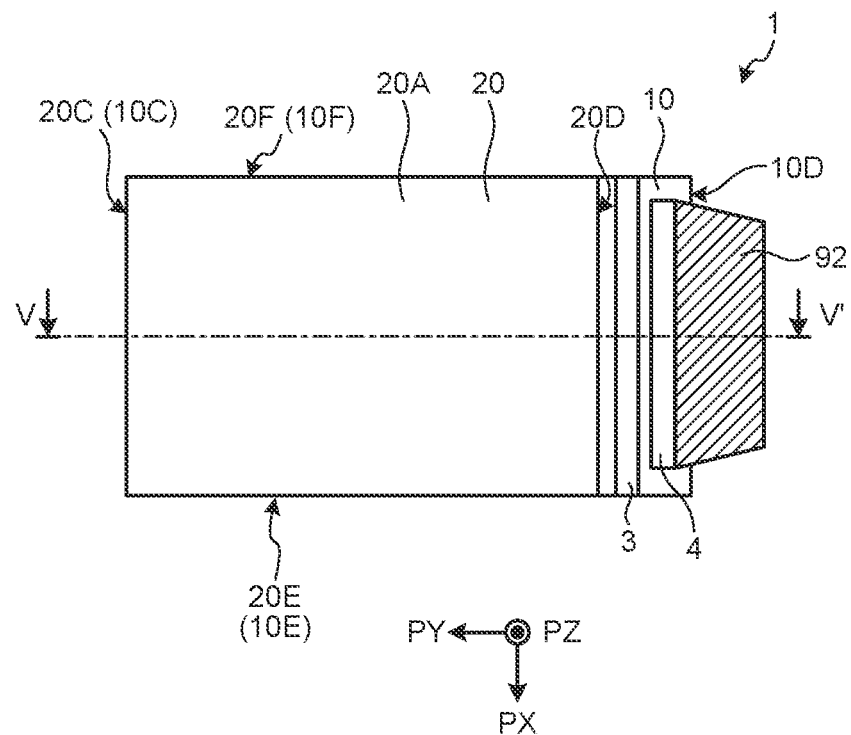
FIG. 6 is a plan view illustrating a planar surface of the display device of FIG. 1.
Figure 7:
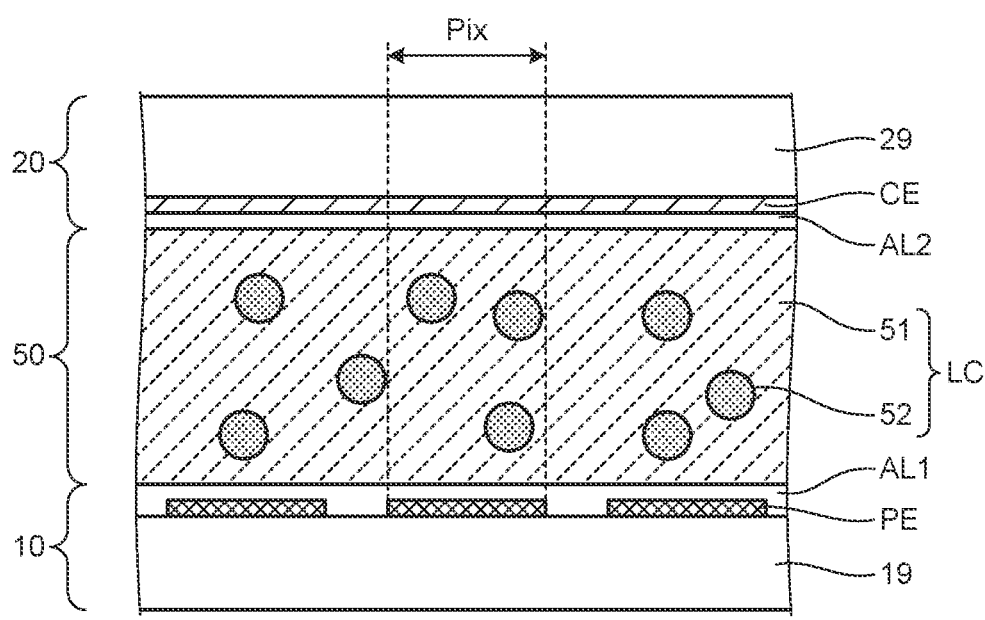
FIG. 7 is an enlarged sectional view obtained by enlarging a liquid crystal layer portion of FIG. 5.
Figure 8:
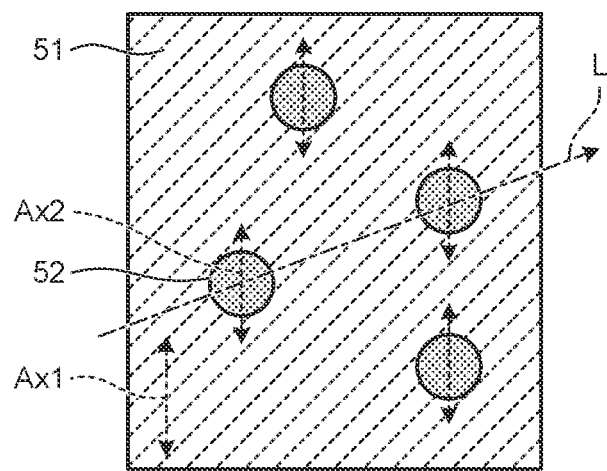
FIG. 8 is a sectional view for explaining a non-scattering state in the liquid crystal layer.
Figure 9:
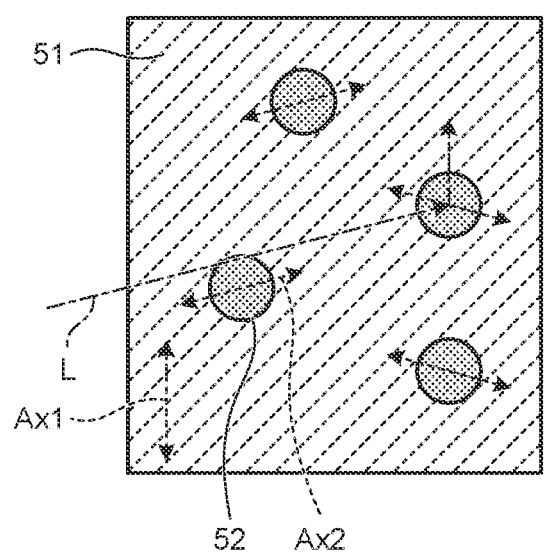
FIG. 9 is a sectional view for explaining the scattering state in the liquid crystal layer.

FIG. 4 is an explanatory diagram illustrating a relation between a voltage applied to the pixel electrode and the scattering state of the pixel. FIG. 5 is a sectional view illustrating an exemplary section of the display device of FIG. 1. FIG. 6 is a plan view illustrating a planar surface of the display device of FIG. 1. FIG. 5 illustrates a V-V section of FIG. 6. FIG. 7 is an enlarged sectional view obtained by enlarging the liquid crystal layer portion of FIG. 5. FIG. 8 is a sectional view for explaining a non-scattering state in the liquid crystal layer. FIG. 9 is a sectional view for explaining the scattering state in the liquid crystal layer.

If the gradation signal depending on the output gradation value of each of the pixels Pix is supplied to the above-described signal lines SL for the pixels Pix selected during one vertical scanning period GateScan, a voltage applied to the pixel electrode PE changes with the gradation signal. The change in the voltage applied to the pixel electrode PE changes the voltage between the pixel electrode PE and the common electrode CE. The scattering state of the liquid crystal layer 50 for each of the pixels Pix is controlled in accordance with the voltage applied to the pixel electrode PE, and the scattering rate in the pixels Pix changes, as illustrated in FIG. 4. As illustrated in FIG. 4, the change in the scattering rate in the pixel Pix is smaller when the voltage applied to the pixel electrode PE is equal to or higher than a saturation voltage Vsat. Therefore, the drive circuit 4 changes the voltage applied to the pixel electrode PE in accordance with the vertical drive signal VDS in a voltage range Vdr lower than the saturation voltage Vsat.

As illustrated in FIGS. 5 and 6, the array substrate 10 has a first principal surface 10A, a second principal surface 10B, a first side surface 10C, a second side surface 10D, a third side surface 10E, and a fourth side surface 10F. The first principal surface 10A and the second principal surface 10B are parallel surfaces. The first side surface 10C and the second side surface 10D are parallel surfaces. The third side surface 10E and the fourth side surface 10F are parallel surfaces.

As illustrated in FIGS. 5 and 6, the counter substrate 20 has a first principal surface 20A, a second principal surface 20B, a first side surface 20C, a second side surface 20D, a third side surface 20E, and a fourth side surface 20F. The first principal surface 20A and the second principal surface 20B are parallel surfaces. The first side surface 20C and the second side surface 20D are parallel surfaces. The third side surface 20E and the fourth side surface 20F are parallel surfaces.

As illustrated in FIGS. 5 and 6, the light source 3 is opposed to the second side surface 20D of the counter substrate 20. The light source 3 is sometimes called a side light source. As illustrated in FIG. 5, the light source 3 emits light-source light L to the second side surface 20D of the counter substrate 20. The second side surface 20D of the counter substrate 20 opposed to the light source 3 serves as a plane of light incidence.

As illustrated in FIG. 5, the light-source light L emitted from the light source 3 propagates in a direction (second direction PY) away from the second side surface 20D while being reflected by the first principal surface 10A of the array substrate 10 and the first principal surface 20A of the counter substrate 20. When the light-source light L travels outward from the first principal surface 10A of the array substrate 10 or the first principal surface 20A of the counter substrate 20, the light-source light L enters a medium having a lower refractive index from a medium having a higher refractive index. Hence, if the angle of incidence of the light-source light L incident on the first principal surface 10A of the array substrate 10 or the first principal surface 20A of the counter substrate 20 is larger than a critical angle, the light-source light L is fully reflected by the first principal surface 10A of the array substrate 10 or the first principal surface 20A of the counter substrate 20.

As illustrated in FIG. 5, the light-source light L that has propagated in the array substrate 10 and the counter substrate 20 is scattered by the pixels Pix including liquid crystals placed in the scattering state, and the angle of incidence of the scattered light becomes an angle smaller than the critical angle. Thus, emission light 68 or 68A is emitted outward from the first principal surface 20A of the counter substrate 20 or the first principal surface 10A of the array substrate 10. The emission light 68 or 68A emitted outward from the first principal surface 20A of the counter substrate 20 or the first principal surface 10A of the array substrate 10 is viewed by the viewer. The following describes the polymer-dispersed liquid crystals placed in the scattering state and the polymer-dispersed liquid crystals in the non-scattering state, using FIGS. 7 to 9.

As illustrated in FIG. 7, the array substrate 10 is provided with a first orientation film AL1, and the counter substrate 20 is provided with a second orientation film AL2. The first and the second orientation films AL1 and AL2 are, for example, vertical orientation films.

A solution containing the liquid crystals and a monomer is filled between the array substrate 10 and the counter substrate 20. Then, in a state where the monomer and the liquid crystals are oriented by the first and the second orientation films AL1 and AL2, the monomer is polymerized by ultraviolet rays or heat to form a bulk 51. This process forms the liquid crystal layer 50 including reverse-mode polymer-dispersed liquid crystals LC in which the liquid crystals are dispersed in gaps of a polymer network formed in a mesh shape.

In this manner, the polymer-dispersed liquid crystals LC contain the bulk 51 formed of the polymer and a plurality of fine particles 52 dispersed in the bulk 51. The fine particles 52 contain the liquid crystals. Both the bulk 51 and the fine particles 52 have optical anisotropy.

The orientation of the liquid crystals contained in the fine particles 52 is controlled by a voltage difference between the pixel electrode PE and the common electrode CE. The orientation of the liquid crystals is changed by the voltage applied to the pixel electrode PE. The degree of scattering of light passing through the pixels Pix changes with change in the orientation of the liquid crystals.

For example, as illustrated in FIG. 8, when no voltage is applied between the pixel electrode PE and the common electrode CE, the direction of an optical axis Ax1 of the bulk 51 is equal to the direction of an optical axis Ax2 of the fine particles 52. The optical axis Ax2 of the fine particles 52 is parallel to the PZ direction of the liquid crystal layer 50. The optical axis Ax1 of the bulk 51 is parallel to the PZ direction of the liquid crystal layer 50 regardless of whether a voltage is applied.

Ordinary-ray refractive indices of the bulk 51 and the fine particles 52 are equal to each other. When no voltage is applied between the pixel electrode PE and the common electrode CE, the difference of refractive index between the bulk 51 and the fine particles 52 is zero in all directions. The liquid crystal layer 50 is placed in the non-scattering state of not scattering the light-source light L. The light-source light L propagates in a direction away from the light source 3 (the light emitter 31) while being reflected by the first principal surface 10A of the array substrate 10 and the first principal surface 20A of the counter substrate 20. When the liquid crystal layer 50 is in the non-scattering state of not scattering the light-source light L, a background on the first principal surface 20A side of the counter substrate 20 is visible from the first principal surface 10A of the array substrate 10, and a background on the first principal surface 10A side of the array substrate 10 is visible from the first principal surface 20A of the counter substrate 20.

As illustrated in FIG. 9, in the space between the pixel electrode PE and the common electrode CE having a voltage applied thereto, the optical axis Ax2 of the fine particles 52 is inclined by an electric field generated between the pixel electrode PE and the common electrode CE. Since the optical axis Ax1 of the bulk 51 is not changed by the electric field, the direction of the optical axis Ax1 of the bulk 51 differs from the direction of the optical axis Ax2 of the fine particles 52. The light-source light L is scattered in the pixel Pix including the pixel electrode PE having a voltage applied thereto. As described above, the viewer views a part of the scattered light-source light L emitted outward from the first principal surface 10A of the array substrate 10 or the first principal surface 20A of the counter substrate 20.

In the pixel Pix including the pixel electrode PE having no voltage applied thereto, the background on the first principal surface 20A side of the counter substrate 20 is visible from the first principal surface 10A of the array substrate 10, and the background on the first principal surface 10A side of the array substrate 10 is visible from the first principal surface 20A of the counter substrate 20. In the display device 1 of the present embodiment, when the first input signal VS is entered from the image transmitter 91, a voltage is applied to the pixel electrode PE of the pixel Pix for displaying an image, and the image based on the third input signal VCSA becomes visible together with the background. In this manner, an image is displayed in the display region when the polymer-dispersed liquid crystals are in a scattering state.

The light-source light L is scattered in the pixel Pix including the pixel electrode PE having a voltage applied thereto, and is emitted outward to display the image, which is displayed so as to be superimposed on the background. In other words, the display device 1 of the present embodiment combines the emission light 68 or the emission light 68A with the background to display the image so as to be superimposed on the background.

A potential of each of the pixel electrodes PE (refer to FIG. 7) written during the one vertical scanning period GateScan illustrated in FIG. 3 needs to be held during at least one of the first color light emission period RON, the second color light emission period GON, and the third color light emission period BON coming after the one vertical scanning period GateScan. If the written potential of each of the pixel electrodes PE (refer to FIG. 7) cannot be held during at least one of the first color light emission period RON, the second color light emission period GON, and the third color light emission period BON coming after the one vertical scanning period GateScan, what are called flickers are likely to occur. In other words, in order to shorten the one vertical scanning period GateScan serving as a time for selecting the scanning lines and increase the visibility in the driving using what is called the field-sequential system, the written potential of each of the pixel electrodes PE (refer to FIG. 7) is required to be easily held during each of the first color light emission period RON, the second color light emission period GON, and the third color light emission period BON.

Figure 10:
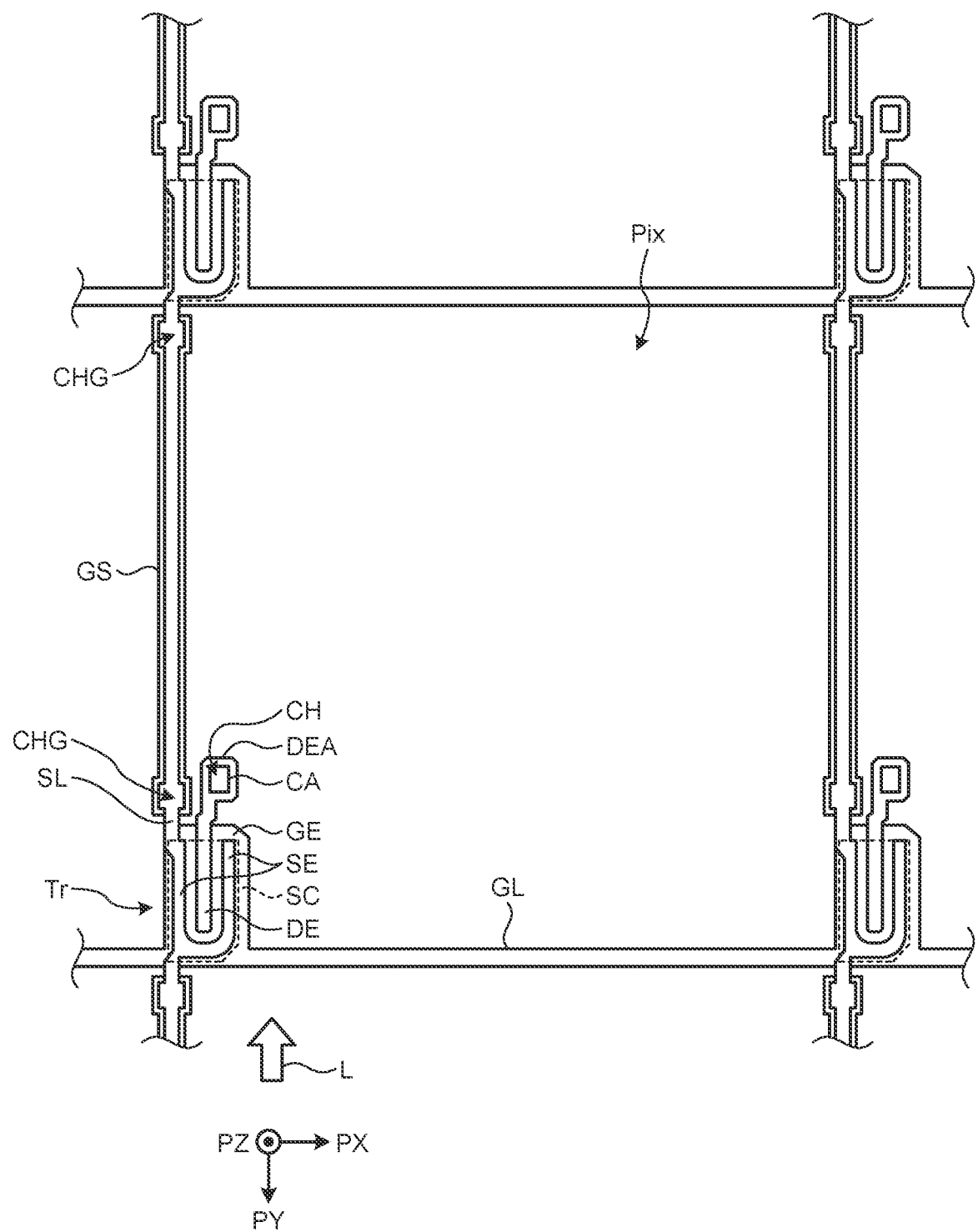
FIG. 10 is a plan view illustrating scanning lines, signal lines, and a switching element in the pixel.
Figure 11:
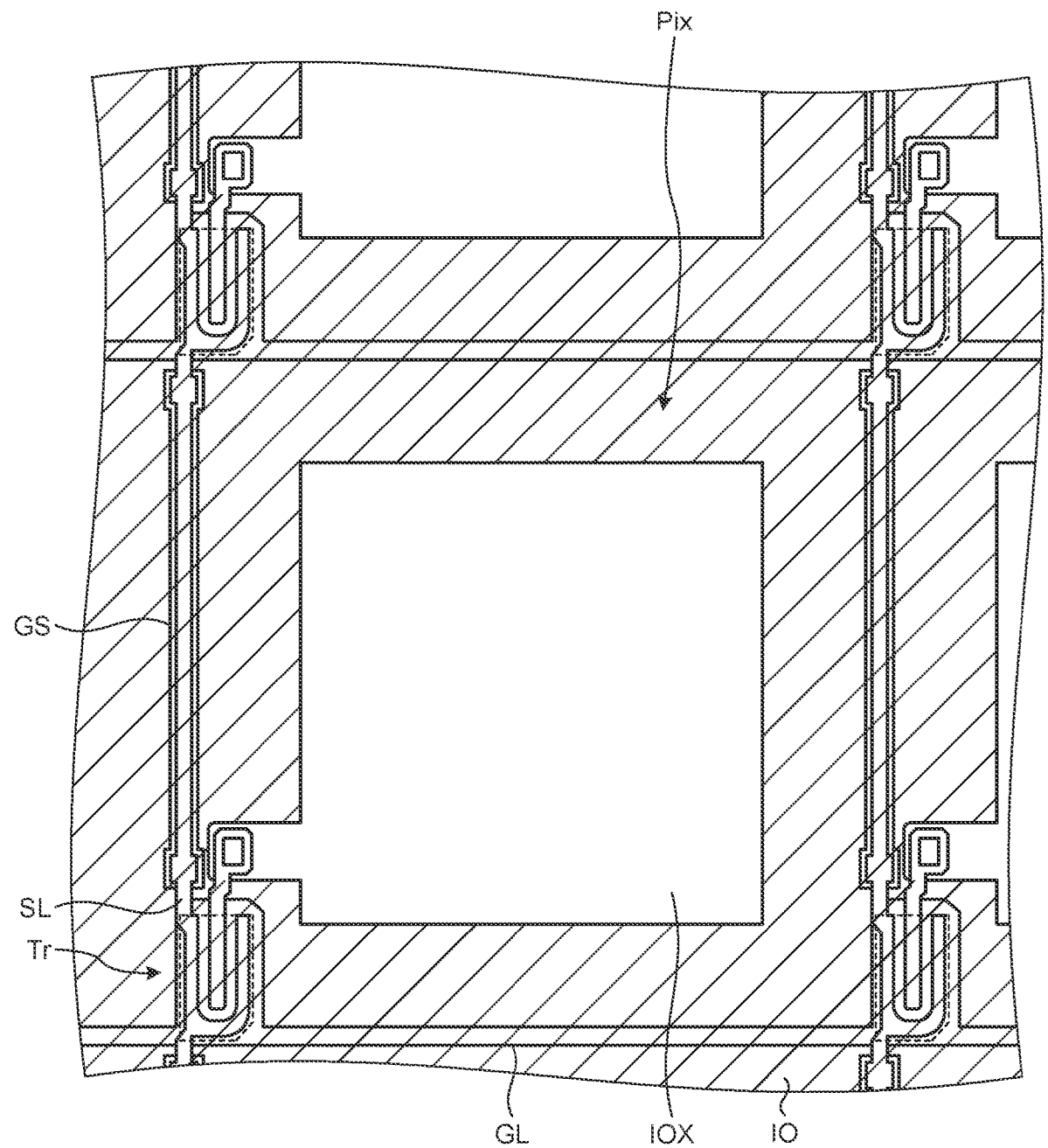
FIG. 11 is a plan view illustrating a holding capacitance layer in the pixel.
Figure 12:
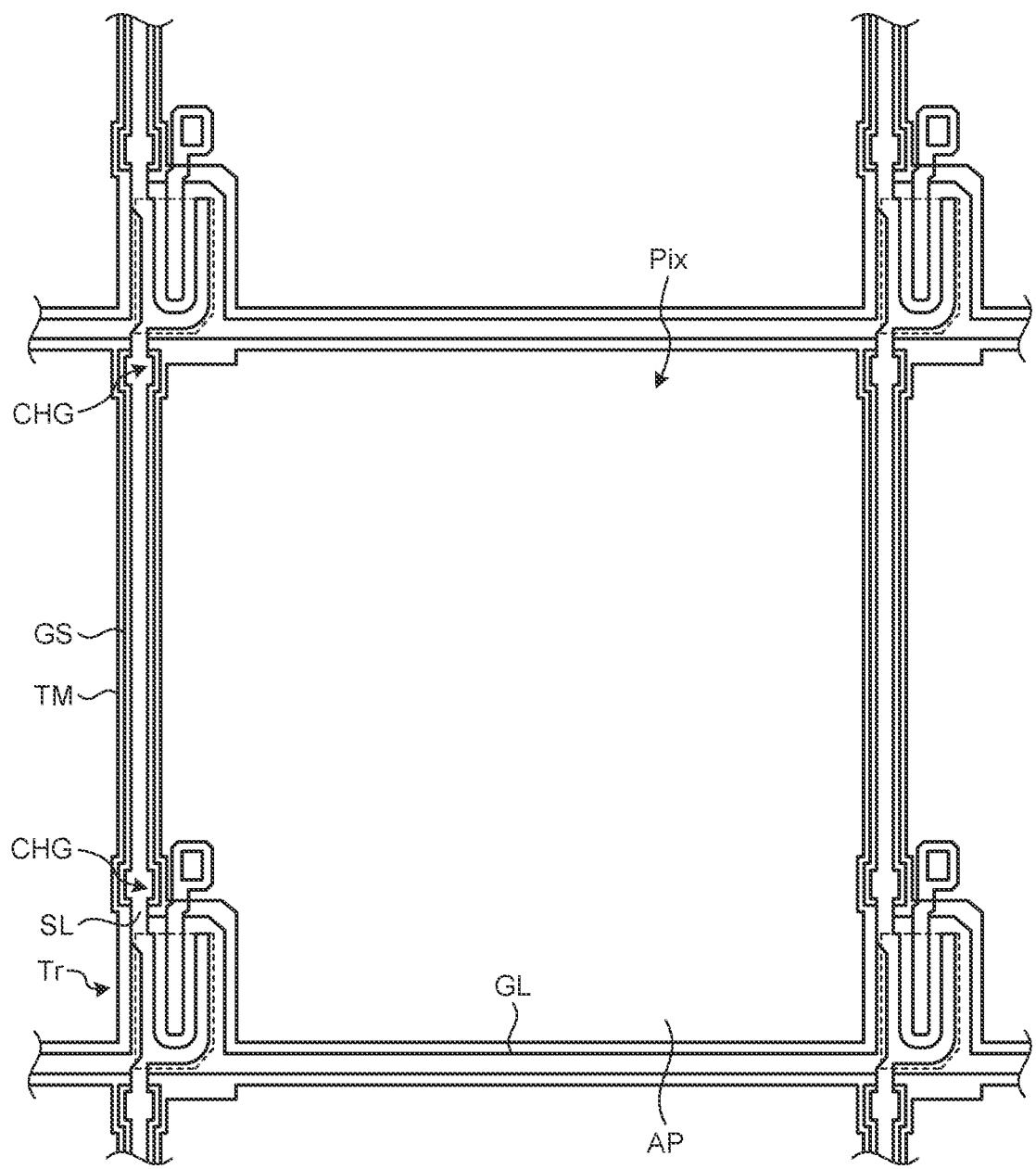
FIG. 12 is a plan view illustrating an auxiliary metal layer and an opening region in the pixel.
Figure 13:
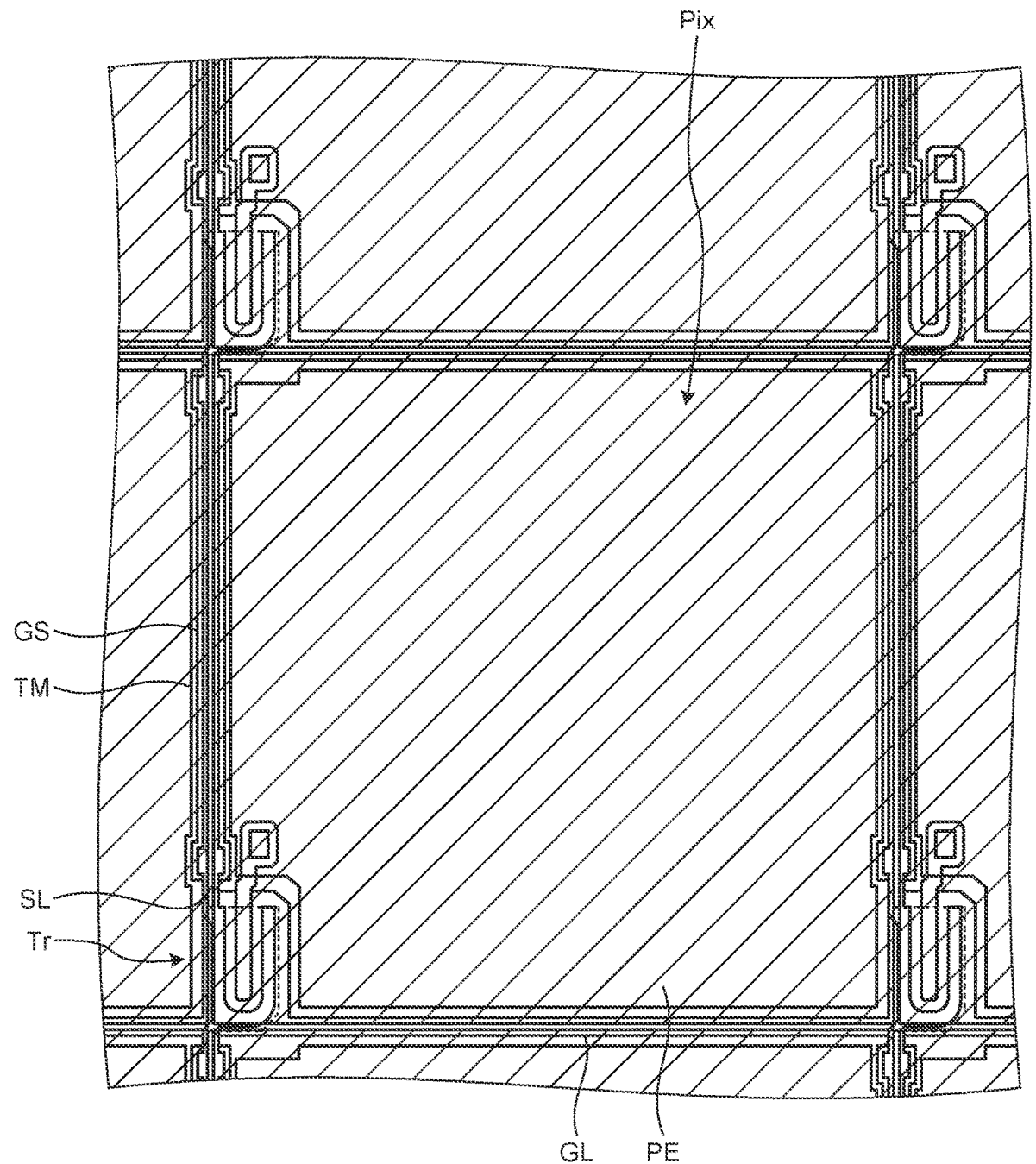
FIG. 13 is a plan view illustrating the pixel electrode in the pixel.
Figure 14:
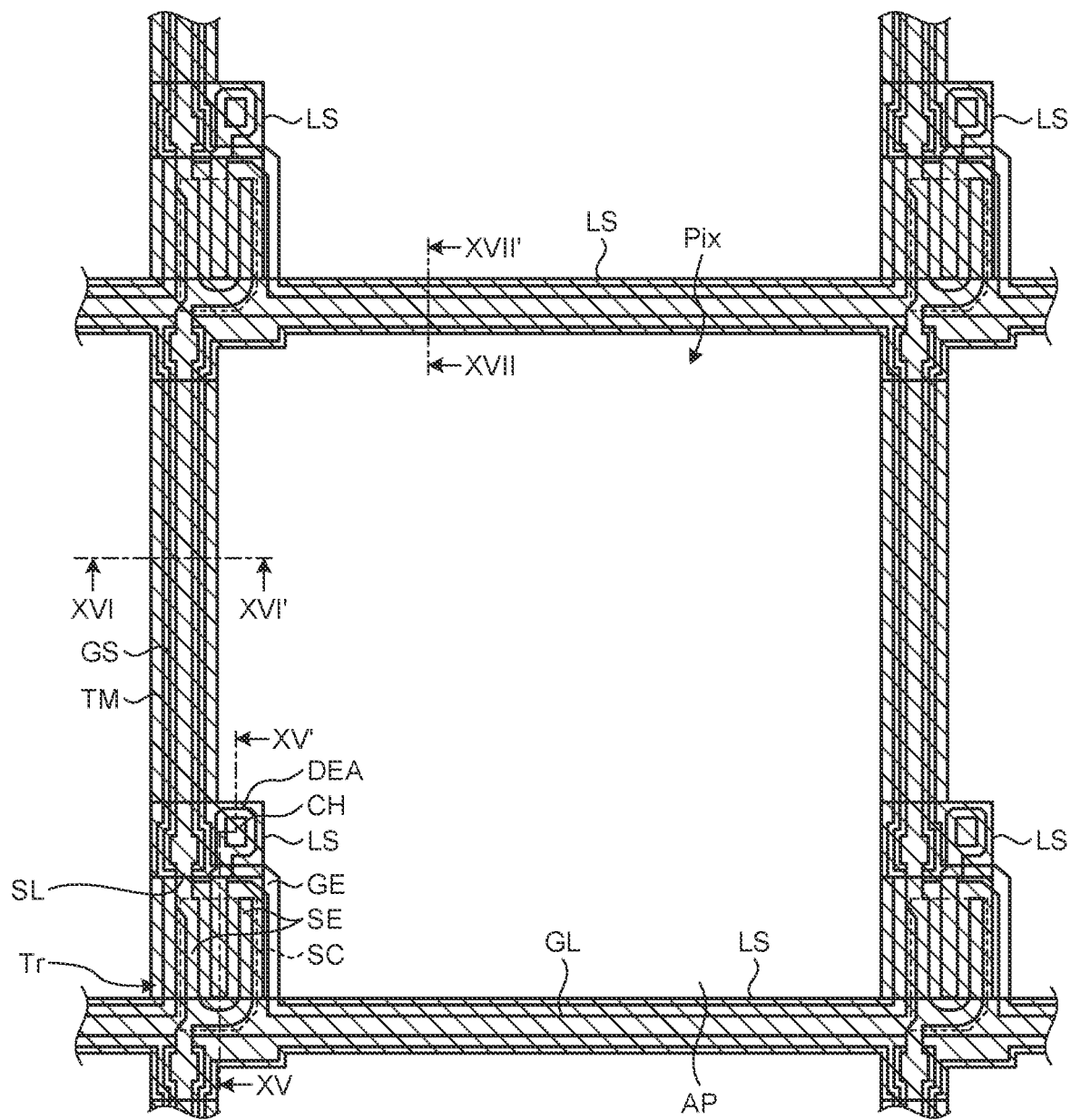
FIG. 14 is a plan view illustrating a light-blocking layer in the pixel.
Figure 15:
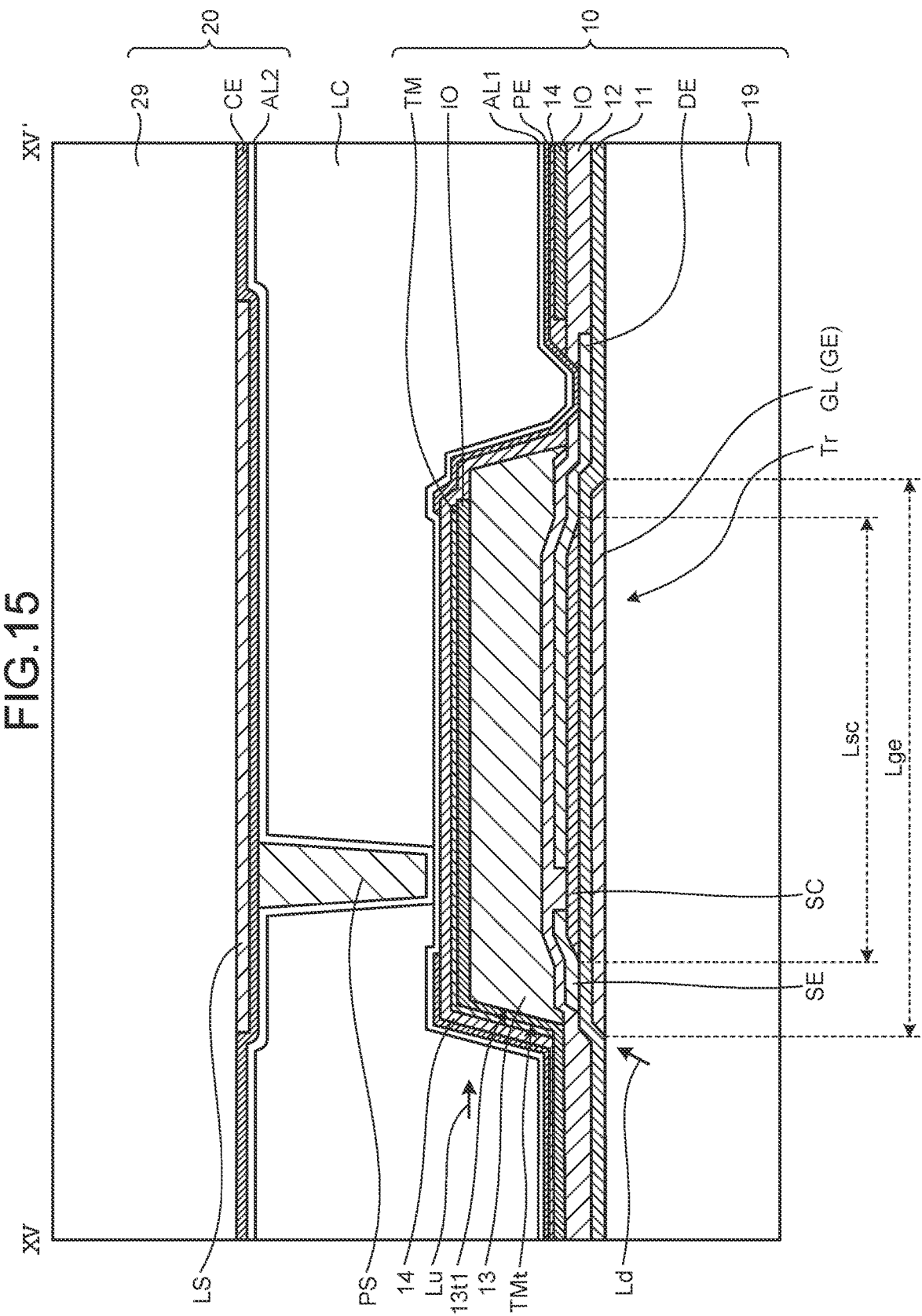
FIG. 15 is a sectional view along XV-XV' of FIG. 14.
Figure 16:
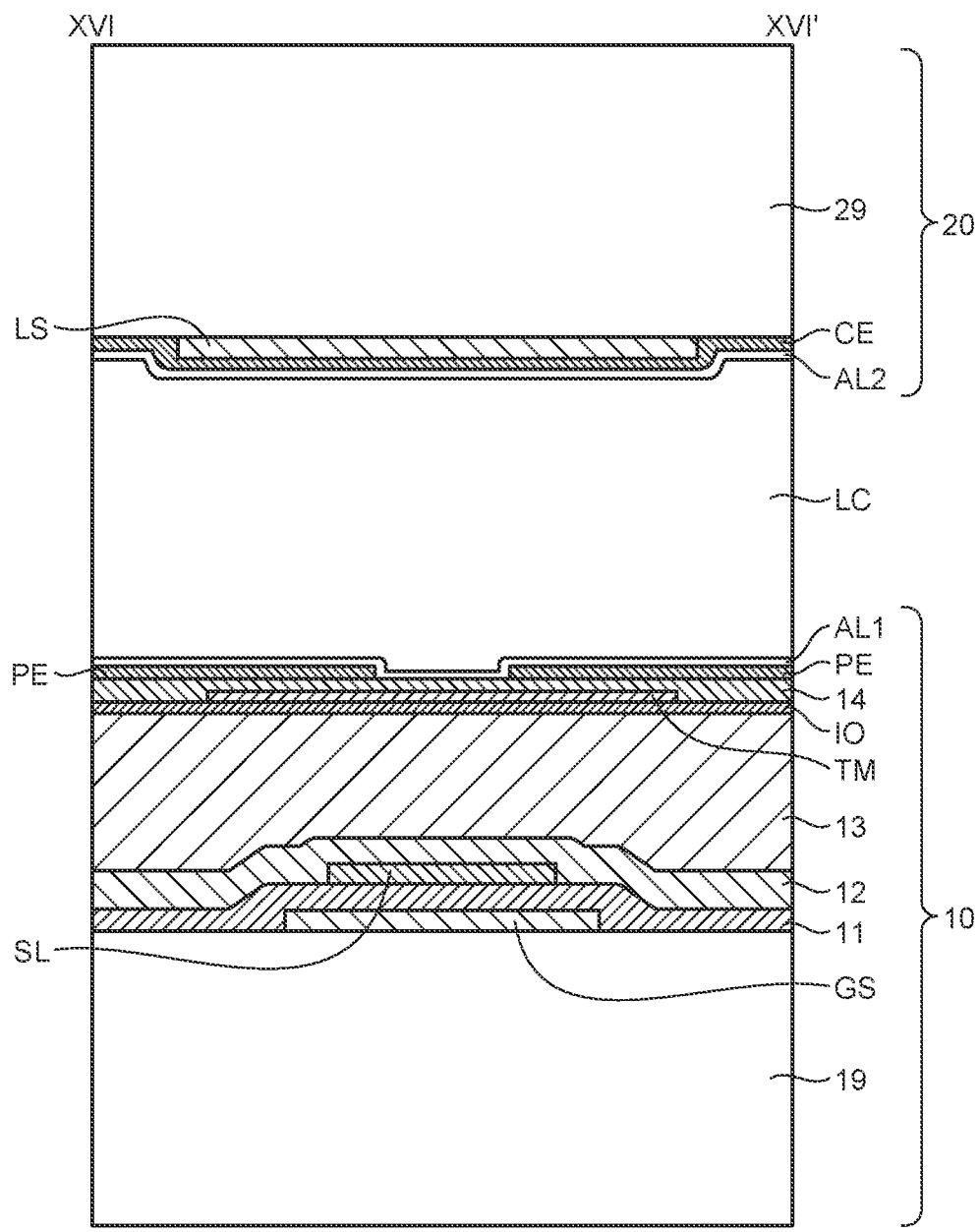
FIG. 16 is a sectional view along XVI-XVI' of FIG. 14.
Figure 17:
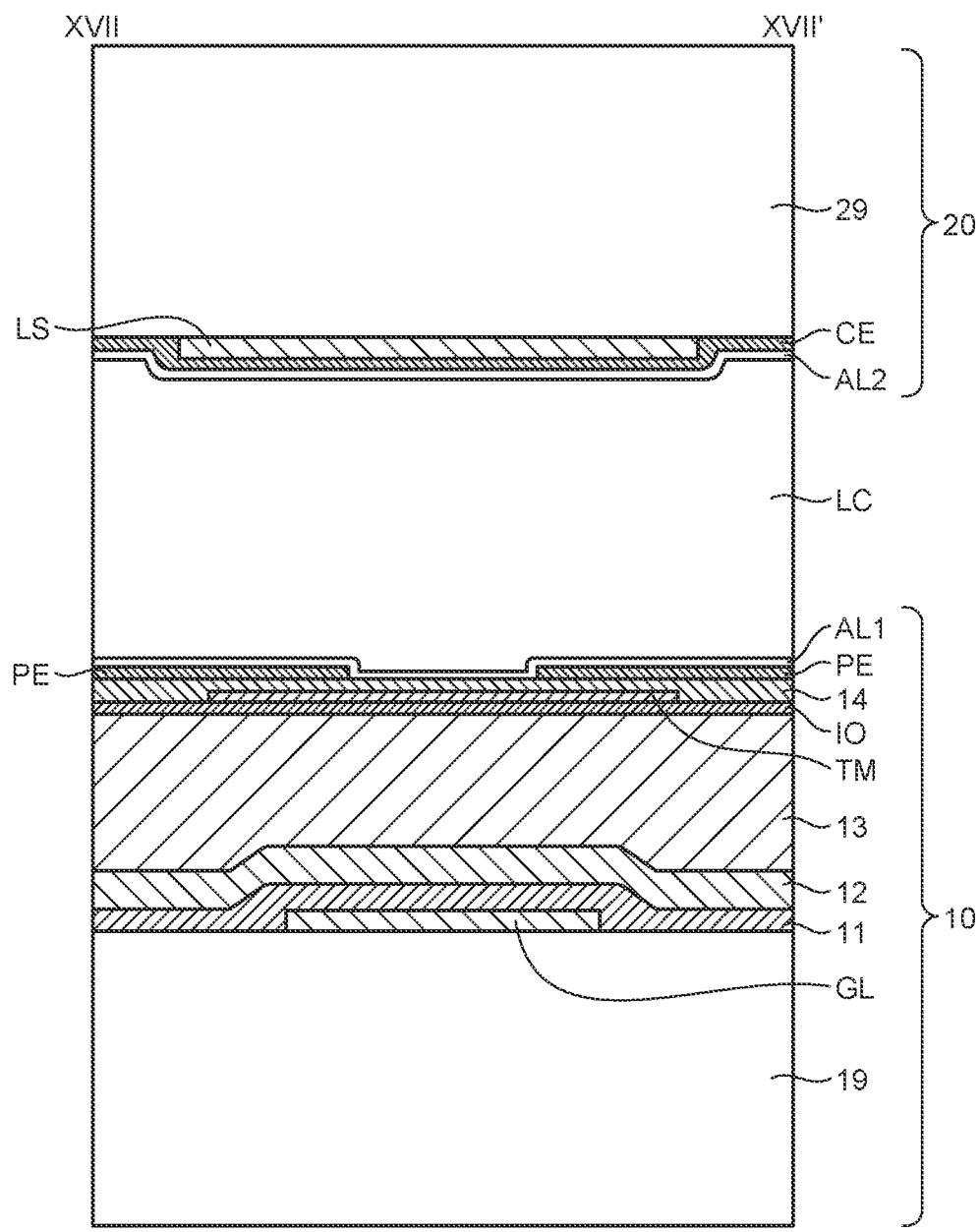
FIG. 17 is a sectional view along XVII-XVII' of FIG. 14.
Figure 18:
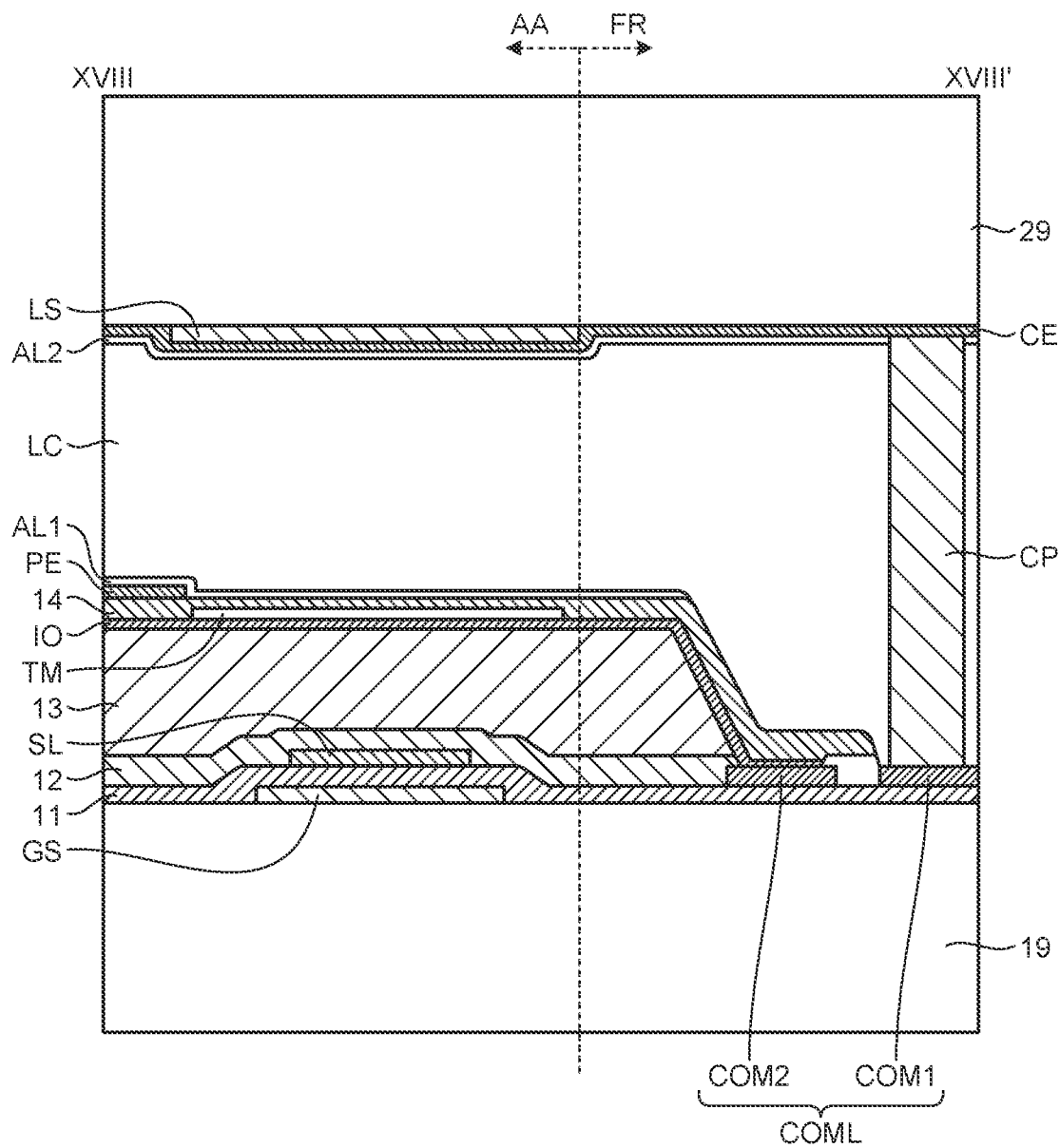
FIG. 18 is a sectional view of a peripheral region.

FIG. 10 is a plan view illustrating the scanning lines, the signal lines, and the switching element in the pixel. FIG. 11 is a plan view illustrating a holding capacitance layer in the pixel. FIG. 12 is a plan view illustrating an auxiliary metal layer and an opening region in the pixel. FIG. 13 is a plan view illustrating the pixel electrode in the pixel. FIG. 14 is a plan view illustrating a light-blocking layer in the pixel. FIG. 15 is a sectional view along XV-XV' of FIG. 14. FIG. 16 is a sectional view along XVI-XVI' of FIG. 14. FIG. 17 is a sectional view along XVII-XVII' of FIG. 14. FIG. 18 is a sectional view of the peripheral region. As illustrated in FIGS. 1, 2, and 10, the array substrate 10 is provided with the signal lines SL and the scanning lines GL so as to form a grid in the plan view. In other words, one surface of the array substrate 10 is provided with the signal lines arranged with spaces in the first direction PX and the scanning lines arranged with spaces in the second direction PY.

As illustrated in FIG. 10, a region surrounded by the adjacent scanning lines GL and the adjacent signal lines SL corresponds to the pixel Pix. The pixel Pix is provided with the pixel electrode PE and the switching element Tr. In the present embodiment, the switching element Tr is a bottom-gate thin film transistor. The switching element Tr includes a semiconductor layer SC overlapping, in the plan view, a gate electrode GE electrically coupled to a corresponding one of the scanning lines GL.

As illustrated in FIG. 10, the scanning lines GL are wiring of a metal such as molybdenum (Mo) or aluminum (Al), a multilayered body of these metals, or an alloy thereof. The signal lines SL are wiring of a metal such as aluminum or an alloy thereof.

As illustrated in FIG. 10, the semiconductor layer SC is provided so as not to protrude from the gate electrode GE in the plan view. As a result, the light-source light L traveling toward the semiconductor layer SC from the gate electrode GE side is reflected, and light leakage is less likely to occur in the semiconductor layer SC.

Figure 20:
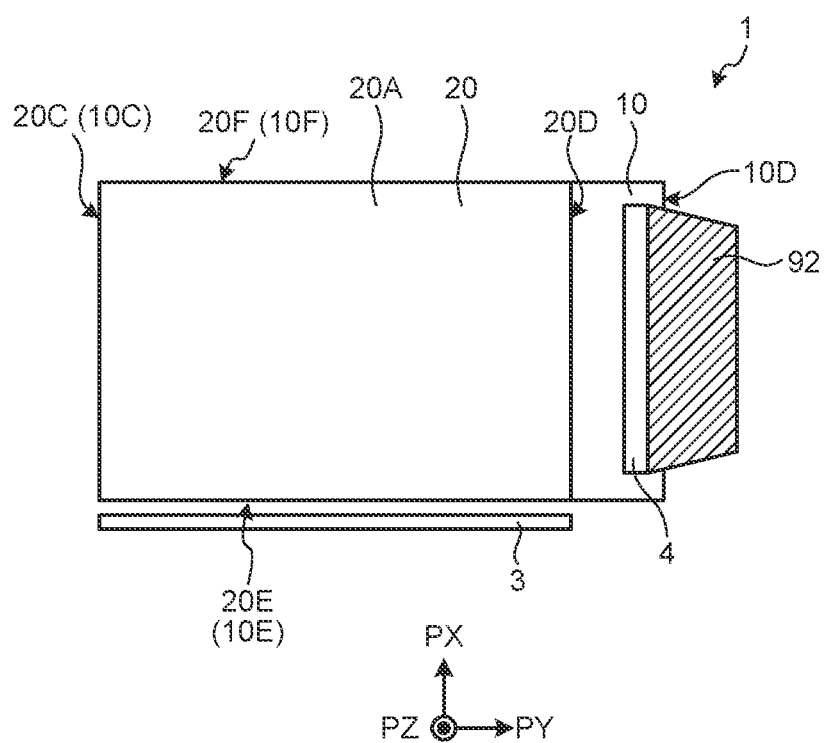
FIG. 20 is a plan view illustrating a planar surface of a display device according to a third embodiment.

As illustrated in FIGS. 5 and 20, the light-source light L emitted from the light source 3 is incident in the second direction PY serving as a direction of incidence. When the direction of incidence of the light-source light L is the second direction PY, the width of the semiconductor layer SC in the first direction is less than the width of the semiconductor layer SC in the second direction. This configuration reduces the width in a direction intersecting the direction of incidence of the light-source light L, and thereby, reduces the effect of light leakage.

As illustrated in FIG. 10, source electrodes SE are formed such that two electrical conductors that are the same as the signal line SL extend from the signal line SL in the same layer as that of the signal line SL and in a direction intersecting the signal line. With this configuration, the source electrodes SE electrically coupled to the signal line SL overlap one end of the semiconductor layer SC in the plan view.

As illustrated in FIG. 10, in the plan view, a drain electrode DE is provided in a position between the adjacent electrical conductors of the source electrodes SE. The drain electrode DE overlaps the semiconductor layer SC in the plan view. A portion of the semiconductor layer SC overlapping neither the source electrodes SE nor the drain electrode DE serves as a channel of the switching element Tr. As illustrated in FIG. 13, a contact electrode DEA electrically coupled to the drain electrode DE is electrically coupled to the pixel electrode PE through a contact hole CH.

As illustrated in FIG. 15, the array substrate 10 includes a first light-transmitting base 19 formed of, for example, glass. The material of the first light-transmitting base 19 may be any material having a light transmitting capability and may be, for example, a resin such as polyethylene terephthalate.

As illustrated in FIG. 15, the scanning line GL (refer to FIG. 10) and the gate electrode GE are provided on the first light-transmitting base 19.

In addition, as illustrated in FIG. 15, a first insulating layer 11 is provided so as to cover the scanning line GL and the gate electrode GE. The first insulating layer 11 is formed of, for example, a transparent inorganic insulating material such as silicon nitride.

The semiconductor layer SC is stacked on the first insulating layer 11. The semiconductor layer SC is formed of, for example, amorphous silicon, but may be formed of polysilicon or an oxide semiconductor. When viewed in the same section, a width Lsc of the semiconductor layer SC is less than a width Lge of the gate electrode GE provided above the semiconductor layer SC. With this configuration, the gate electrode GE can block light Ld that has propagated in the first light-transmitting base 19. As a result, light leakage of the switching element Tr of the first embodiment is reduced.

The source electrode SE and the signal line SL covering portions of the semiconductor layer SC and the drain electrode DE covering a portion of the semiconductor layer SC are provided on the first insulating layer 11. The drain electrode DE is formed of the same material as that of the signal line SL. A second insulating layer 12 is provided on the semiconductor layer SC, the signal line SL, and the drain electrode DE. The second insulating layer 12 is formed of, for example, a transparent inorganic insulating material such as silicon nitride, in the same manner as the first insulating layer 11.

A third insulating layer covering a portion of the second insulating layer 12 is formed on the second insulating layer 12. A third insulating layer 13 is formed of, for example, a light-transmitting organic insulating material such as an acrylic resin. The third insulating layer 13 has a film thickness greater than other insulating films formed of an inorganic material.

As illustrated in FIGS. 15, 16, and 17, some regions have the third insulating layer 13 while the other regions do not have the third insulating layer 13. As illustrated in FIGS. 16 and 17, the regions having the third insulating layer 13 are located over the scanning lines GL and over the signal lines SL. The third insulating layer 13 has a grid shape along the scanning lines GL and the signal lines SL that covers over the scanning lines GL and the signal lines SL. As illustrated in FIG. 15, the regions having the third insulating layer 13 are also located over the semiconductor layer SC, that is, over the switching elements Tr. As a result, the switching element Tr, the scanning line GL, and the signal line SL are located at relatively long distances from the holding capacitance electrode IO and are thereby less affected by a common potential from the holding capacitance electrode 10. In addition, regions on the array substrate 10 not having the third insulating layer 13 are provided in the regions surrounded by the scanning lines GL and the signal lines SL. Thus, regions are provided in which the thickness of the insulating layer is less than the thickness of the insulating layer overlapping the signal lines SL and the scanning lines GL in the plan view. The regions surrounded by the scanning lines GL and the signal lines SL have relatively higher optical transmittance than the regions over the scanning lines GL and over the signal lines SL, and thus, are improved in light transmitting capability.

As illustrated in FIG. 15, the holding capacitance electrode IO is provided on the third insulating layer 13. The holding capacitance electrode IO is formed of a light-transmitting conductive material such as indium tin oxide (ITO). The holding capacitance electrode IO is also called "third light-transmitting electrode". As illustrated in FIG. 11, the holding capacitance electrode IO has a region IOX including no light-transmitting conductive material in each of the regions surrounded by the scanning lines GL and the signal lines SL. The holding capacitance electrode IO extends across the adjacent pixels Pix and is provided over the pixels Pix. A region of the holding capacitance electrode IO including the light-transmitting conductive material overlaps the scanning line GL or the signal line SL and extends to the adjacent pixel Pix.

The holding capacitance electrode IO has a grid shape that covers over the scanning lines GL and the signal lines SL along the scanning lines GL and the signal lines SL. With this configuration, the holding capacitance HC between the region IOX including no light-transmitting conductive material and the pixel electrode PE is reduced in capacity. Therefore, the holding capacitance HC is adjusted by the size of the region IOX including no light-transmitting conductive material.

As illustrated in FIG. 15, a portion on the holding capacitance electrode IO is provided with a conductive metal layer TM. The conductive metal layer TM is wiring of a metal such as molybdenum (Mo) or aluminum (Al), a laminated body of these metals, or an alloy thereof. As illustrated in FIG. 12, the metal layer TM is provided in regions overlapping the signal lines SL, the scanning lines GL, and the switching elements Tr in the plan view. With this configuration, the metal layer TM is formed into a grid shape, and openings AP surrounded by the metal layer TM are formed.

As illustrated in FIG. 12, the switching element Tr that is coupled to the scanning lines GL and the signal lines SL is provided. At least the switching element Tr is covered with the third insulating layer 13 serving as an organic insulating layer, and the metal layer TM having a larger area than that of the switching element Tr is located above the third insulating layer 13. This configuration can reduce light leakage of the switching element Tr.

The metal layer TM may be located below the holding capacitance electrode IO, and only needs to be stacked with the holding capacitance electrode 10. The metal layer TM has a lower electrical resistance than that of the holding capacitance electrode 10. Therefore, the potential of the holding capacitance electrode IO is restrained from varying with the position where the pixel Pix is located, of the display region AA.

As illustrated in FIG. 12, the width of the metal layer TM overlapping the signal line SL is greater than the width of the signal line SL in the plan view. This configuration restrains reflected light reflected by edges of the signal line SL from being emitted from the display panel 2. The width of the metal layer TM and the width of the signal line SL are lengths in a direction intersecting the extending direction of the signal line SL. The width of the metal layer TM overlapping the scanning line GL is greater than the width of the scanning line GL. The width of the metal layer TM and the width of the scanning line GL are lengths in a direction intersecting the extending direction of the scanning line GL.

As illustrated in FIG. 15, a fourth insulating layer 14 is provided on the upper side of the holding capacitance electrode IO and the metal layer TM. The fourth insulating layer 14 is an inorganic insulating layer formed of, for example, a transparent inorganic insulating material such as silicon nitride.

As illustrated in FIG. 15, the pixel electrode PE is provided on the fourth insulating layer 14. The pixel electrode PE is formed of a light-transmitting conductive material such as ITO. The pixel electrode PE is electrically coupled to the contact electrode DEA through the contact hole CH provided in the fourth insulating layer 14, the third insulating layer 13, and the second insulating layer 12. As illustrated in FIG. 13, each of the pixel electrodes PE is partitioned off on a pixel Pix basis. The first orientation film AL1 is provided on the upper side of the pixel electrode PE.

As illustrated in FIG. 15, the counter substrate 20 includes a second light-transmitting base 29 formed of, for example, glass. The material of the second light-transmitting base 29 may be any material having a light transmitting capability and may be, for example, a resin such as polyethylene terephthalate. The second light-transmitting base 29 is provided with the common electrode CE. The common electrode CE is formed of a light-transmitting conductive material such as ITO. The second orientation film AL2 is provided on a surface of the common electrode CE. The counter substrate 20 includes the light-blocking layer LS between the second light-transmitting base 29 and the common electrode CE. The light-blocking layer LS is formed of a black resin or a metal material. A spacer PS is provided between the array substrate 10 and the counter substrate 20, and the spacer PS is located between the common electrode CE and the second orientation film AL2.

As illustrated in FIGS. 12 and 16, in the display device of the first embodiment, a light-blocking layer GS located in the same layer as that of the scanning line GL is provided in a position extending along the signal line SL and overlapping a portion of the signal line SL. The light-blocking layer GS is formed of the same material as that of the scanning line GL. The light-blocking layer GS is not provided at a portion where the scanning line GL intersects the signal line SL in the plan view.

As illustrated in FIG. 12, the light-blocking layer GS is electrically coupled to the signal line SL through a contact hole CHG. With this configuration, the wiring resistance of a combination of the light-blocking layer GS and the signal line SL is lower than that of only the signal line SL. As a result, the delay of the gradation signal supplied to the signal line SL is reduced. The contact holes CHG may not be provided, and the light-blocking layer GS may not be coupled to the signal line SL.

As illustrated in FIG. 16, the light-blocking layer GS is provided opposite to the metal layer TM with the signal line SL therebetween. The width of the light-blocking layer GS is greater than that of the signal line SL and less than that of the metal layer TM. The width of the light-blocking layer GS, the width of the metal layer TM, and the width of the signal line SL are lengths in a direction intersecting the extending direction of the signal line SL. In this manner, the light-blocking layer GS has a greater width than that of the signal line SL, and thus, restrains the reflected light reflected by the edges of the signal line SL from being emitted from the display panel 2. As a result, visibility of images is improved in the display device 1.

As illustrated in FIGS. 14 and 15, the counter substrate 20 is provided with the light-blocking layer LS. The light-blocking layer LS is provided in a region overlapping the signal line SL, the scanning line GL, and the switching element Tr in the plan view.

As illustrated in FIGS. 14, 15, 16, and 17, the light-blocking layer LS has a greater width than that of the metal layer TM. This configuration restrains reflected light reflected by edges of the signal line SL, the scanning line GL, and the metal layer TM from being emitted from the display panel 2. As a result, the visibility of images is improved in the display device 1.

The contact hole CH and the contact hole CHG are likely to diffusely reflect the light-source light L emitted thereto. Therefore, the light-blocking layer LS is provided in a region overlapping the contact hole CH and the contact hole CHG in the plan view.

As illustrated in FIG. 15, the spacer PS is disposed between the array substrate 10 and the counter substrate 20 and improves uniformity of distance between the array substrate 10 and the counter substrate 20.

As illustrated in FIG. 18, the common potential wiring COML is routed in the peripheral region FR. The common potential wiring COML includes, for example, first common potential wiring COM1 and second common potential wiring COM2. The first common potential wiring COM1 is electrically coupled to the common electrode CE of the counter substrate 20 through a conductive member CP having electrical conductivity. The conductive member CP may be a conductive pillar, or may be a sealing material containing conductive particles such as Au particles.

As illustrated in FIG. 18, in the peripheral region FR, the holding capacitance electrode 10 is electrically coupled to the second common potential wiring COM2. The metal layer TM is disposed in the display region AA.

As described above, the display device 1 includes the array substrate 10, the counter substrate 20, the liquid crystal layer 50, and the light source 3. The array substrate 10 includes the pixel electrodes PE serving as first light-transmitting electrodes each disposed in a corresponding one of the pixels Pix. The array substrate 10 is provided with the signal lines SL arranged with spaces in the first direction PX and the scanning lines GL arranged with spaces in the second direction PY. The counter substrate 20 includes positions that overlap the pixel electrodes PE in the plan view and are provided with the common electrode CE serving as a second light-transmitting electrode. The liquid crystal layer 50 includes the polymer-dispersed liquid crystals LC filled between the array substrate 10 and the counter substrate 20. The light emitters 31 of the light source 3 emit the light in the second direction PY to a side surface of the counter substrate 20. The direction of incidence of the light that propagates in the array substrate 10 and the counter substrate 20 is the second direction. The light emitters 31 may emit the light that propagates in the array substrate 10 and the counter substrate 20 toward a side surface of the array substrate 10.

The array substrate 10 includes the third insulating layer 13 serving as the organic insulating layer that covers at least the switching element Tr, and the metal layer TM that is provided above the third insulating layer 13 so as to overlap the third insulating layer 13 and has a larger area than that of the switching element Tr. Each of the regions surrounded by the scanning lines GL and the signal lines SL has a region having a thickness less than that of the third insulating layer 13 overlapping the scanning lines GL and the signal lines SL in the plan view. As a result, a metal layer TMt covers a first slant surface 13t1 of the third insulating layer 13 overlapping the switching element Tr as illustrated in FIG. 15, the first slant surface 13t1 being a slant surface that is located, in the plan view, on a side of the third insulating layer 13 closer to the light source 3 than the switching element Tr is, and along which the thickness of the third insulating layer 13 changes. The metal layer TMt is a tapered portion that is made of the same material as that of the metal layer TM, and is formed by extending the metal layer TM.

As illustrated in FIGS. 5 and 20, the light-source light L emitted from the light source 3 is incident in the second direction PY serving as the direction of incidence. Light Lu arrives as illustrated in FIG. 15. The light Lu is a part of the light-source light L that arrives from a side closer to the light source 3 than the switching element Tr is. The metal layer TMt blocks the light Lu, and thereby, reduces light leakage.

The metal layer TM may not be provided on slant surfaces other than the first slant surface of the third insulating layer 13 overlapping the switching element Tr along which the thickness of the third insulating layer 13 changes.

Second Embodiment

Figure 19:
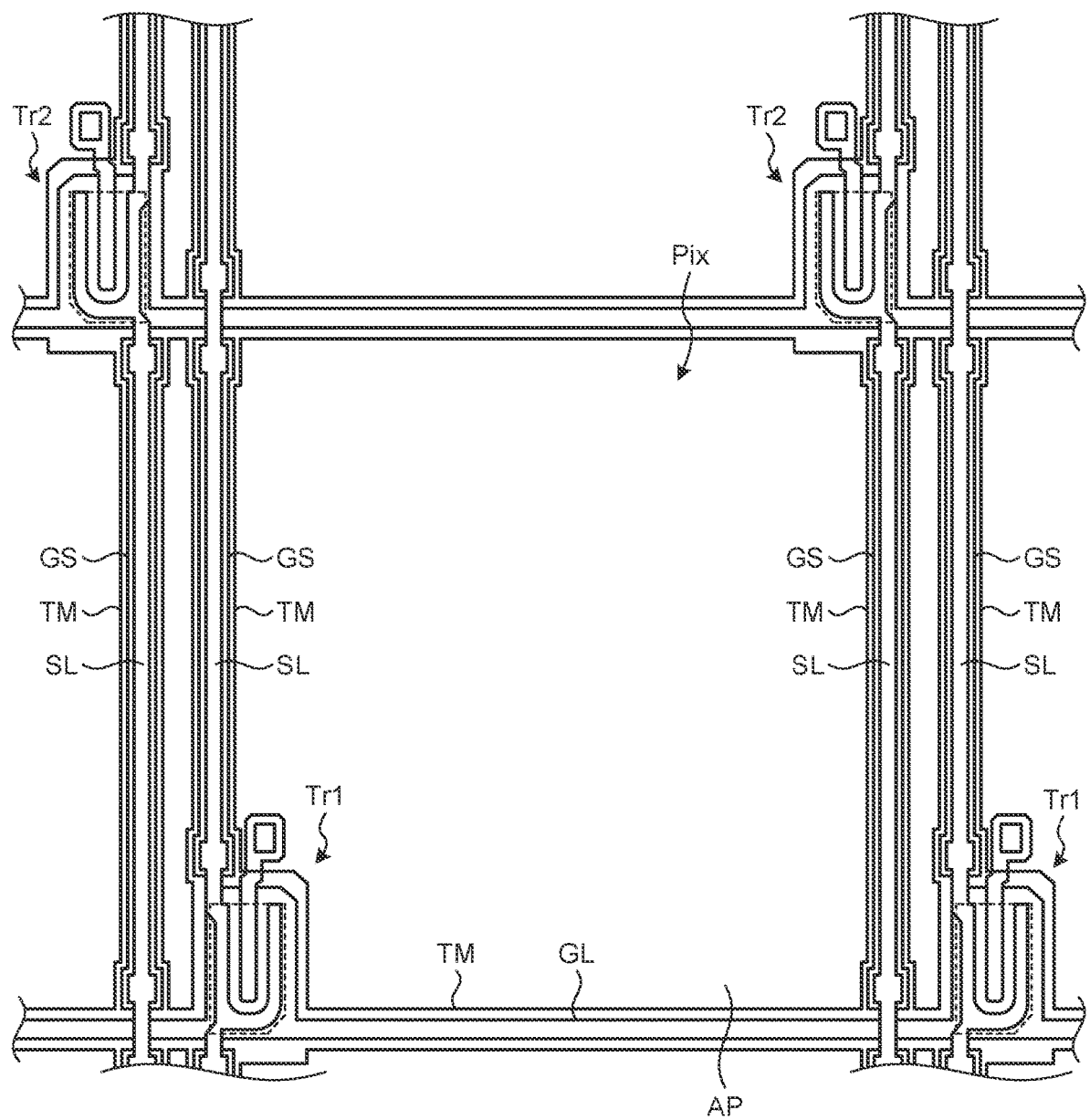
FIG. 19 is a plan view illustrating a pixel according to a second embodiment.

FIG. 19 is a plan view illustrating a pixel according to a second embodiment. The same components as those described in the above-described embodiment are denoted by the same reference numerals, and the description thereof will not be repeated.

As illustrated in FIG. 19, the pixels Pix of the second embodiment have a configuration in which, unlike in the configuration of the pixels Pix of the first embodiment, two of the signal lines SL are provided between the adjacent pixels Pix. One of the signal lines SL is electrically coupled to switching elements Tr1 provided at intersections of the one signal line SL and the scanning lines GL for every other pixel Pix. The other of the signal lines SL is electrically coupled to switching elements Tr2 provided at intersections of the other signal line SL and the scanning lines GL for every other pixel Pix except the pixel Pix having the switching element Tr1.

This configuration allows the gate drive circuit 43 to simultaneously select adjacent two of the scanning lines GL. As a result, the one vertical scanning period GateScan illustrated in FIG. 3 is reduced. Reducing the one vertical scanning period GateScan can relatively increase the first color light emission period RON, the second color light emission period GON, and the third color light emission period BON coming after the one vertical scanning period GateScan.

Third Embodiment

Figure 21:
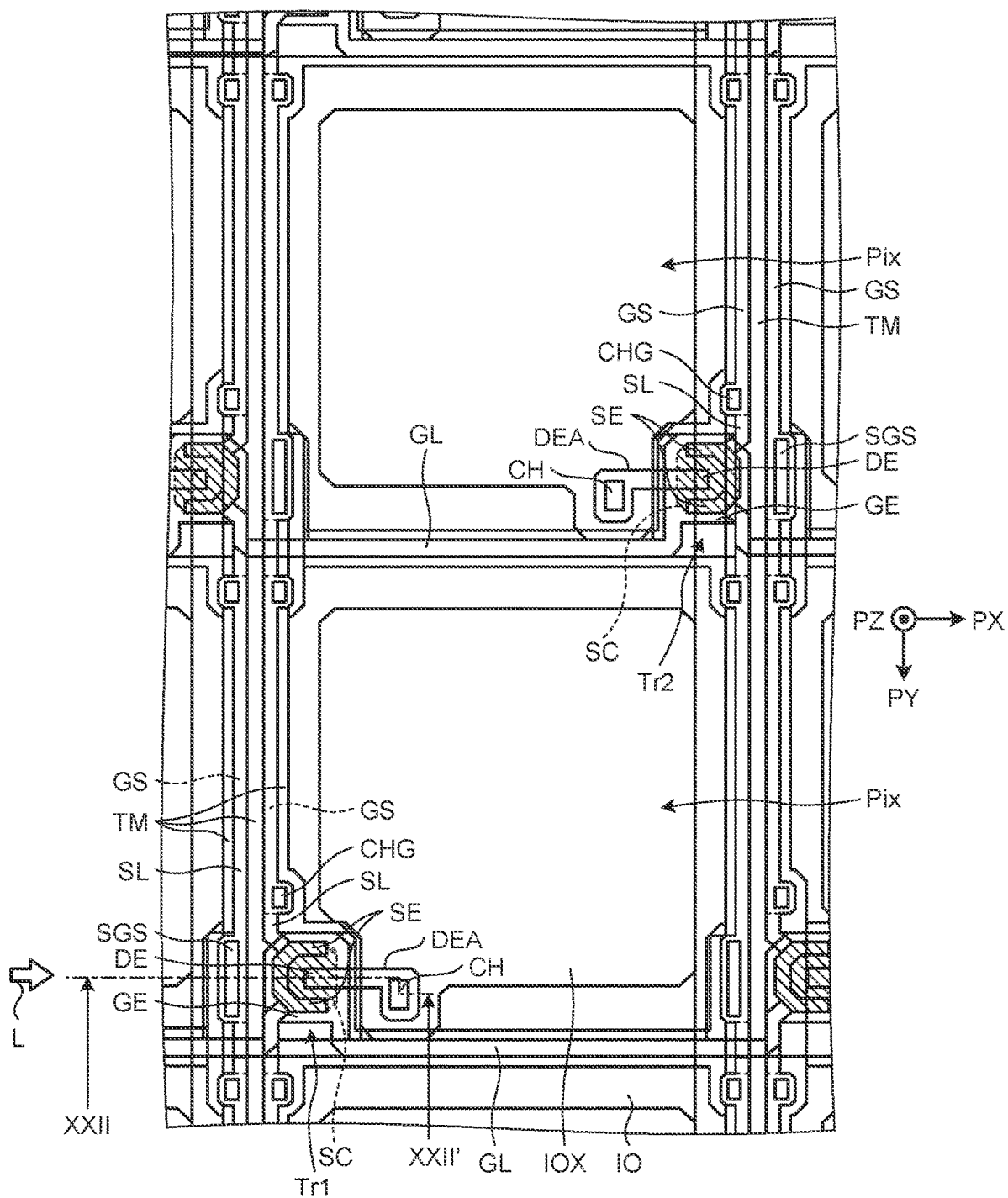
FIG. 21 is a plan view illustrating the scanning lines, the signal lines, and switching elements in the pixels according to the third embodiment.
Figure 22:
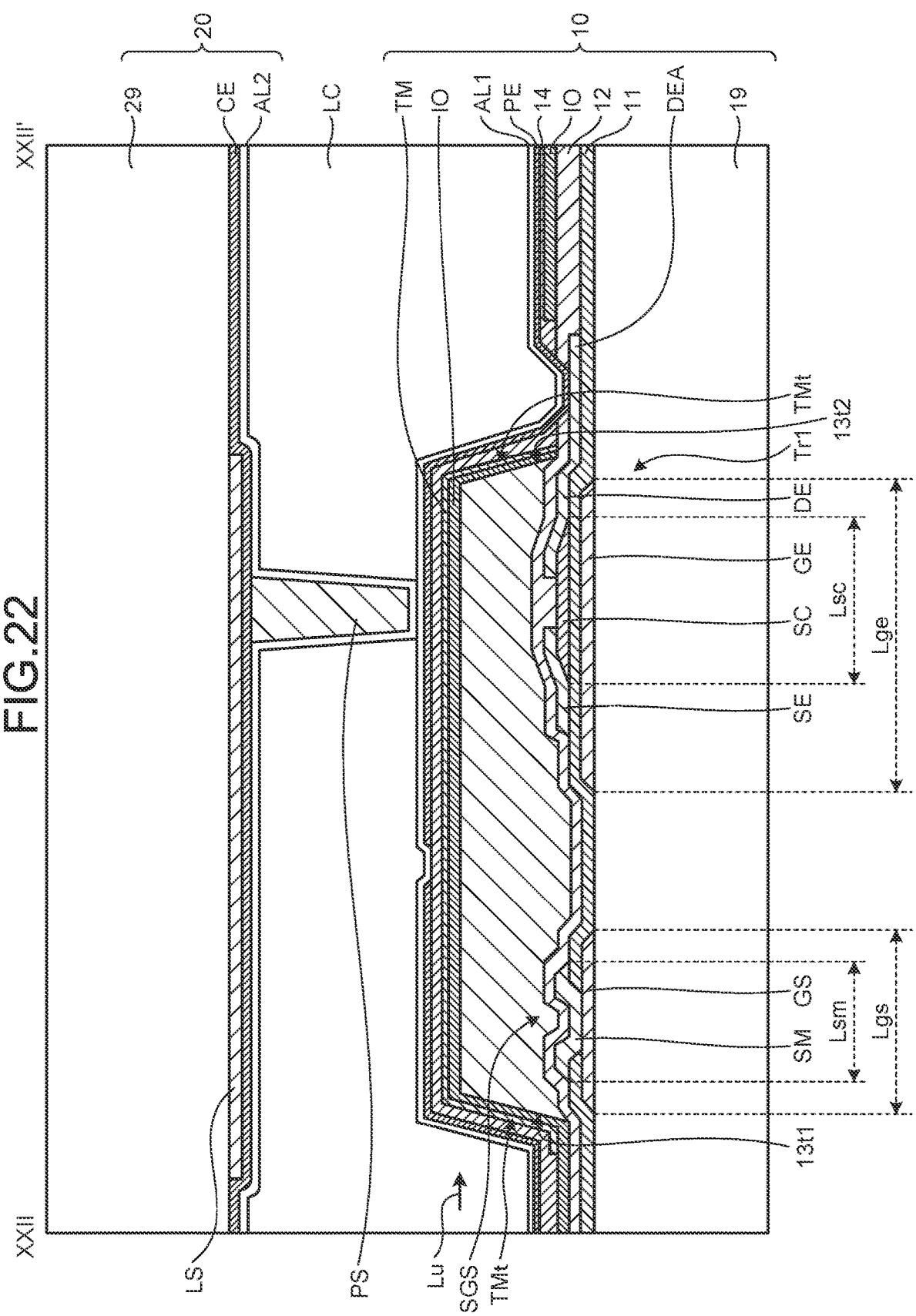
FIG. 22 is a sectional view along XXII-XXII' of FIG. 21.

FIG. 20 is a plan view illustrating a planar surface of a display device according to a third embodiment. FIG. 21 is a plan view illustrating the scanning lines, the signal lines, and switching elements in the pixels according to the third embodiment. FIG. 22 is a sectional view along XXII-XXII' of FIG. 21. The same components as those described in either of the above-described embodiments are denoted by the same reference numerals, and the description thereof will not be repeated.

As illustrated in FIG. 20, the light source 3 is opposed to the third side surface 10E of the array substrate 10 or the third side surface 20E of the counter substrate 20. For example, as illustrated in FIG. 20, the light source 3 emits the light-source light L to the third side surface 20E of the counter substrate 20. The third side surface 20E of the counter substrate 20 opposed to the light source 3 serves as the plane of light incidence. The light-source light L emitted from the light source 3 propagates in a direction (first direction PX) away from the third side surface 10E of the array substrate 10 or the third side surface 20E of the counter substrate 20 while being reflected by the first principal surface 10A of the array substrate 10 and the first principal surface 20A of the counter substrate 20.

As illustrated in FIG. 21, the pixels Pix of the third embodiment have a configuration in which, unlike in the configuration of the pixels Pix of the first embodiment, two of the signal lines SL are provided between the adjacent pixels Pix. One of the signal lines SL is electrically coupled to the switching elements Tr1 provided at intersections of the one signal line SL and the scanning lines GL for every other pixel Pix. The other of the signal lines SL is electrically coupled to the switching elements Tr2 provided at intersections of the other signal line SL and the scanning lines GL for every other pixel Pix except the pixel Pix having the switching element Tr1.

This configuration allows the gate drive circuit 43 to simultaneously select adjacent two of the scanning lines GL. As a result, the one vertical scanning period GateScan illustrated in FIG. 3 is reduced. Reducing the one vertical scanning period GateScan illustrated in FIG. 3, can relatively increase the first color light emission period RON, the second color light emission period GON, and the third color light emission period BON coming after the one vertical scanning period GateScan.

As illustrated in FIGS. 21 and 22, the light-source light L propagates along the first direction PX. The light entrance direction is a direction along the first direction PX. Therefore, as illustrated in FIG. 21, a light-blocking structure SGS is provided on a side of the switching element Tr1 closer to the light emitters 31 of the side light source 3 in the light entrance direction. In the second direction PY intersecting the light entrance direction, the length of the light-blocking structure SGS is greater than the length of the semiconductor layer SC. This configuration allows the light-blocking structure SGS to block a light path of the light propagating toward the switching element Tr1, and reduce light leakage of the switching element Tr1.

The light-blocking structure SGS is formed such that the light-blocking layer GS in the same layer as that of the scanning line GL extends, and a first light-blocking layer SM formed of a conductive material located in the same layer as that of the signal line SL is stacked on a conductive material of the light-blocking layer GS. In this manner, the light-blocking structure SGS is located on an extension line of the signal line SL.

As illustrated in FIGS. 21 and 22, the switching element Tr1 is covered with the third insulating layer 13 serving as the organic insulating layer, and the first slant surface 13t1 on the light incidence side of the third insulating layer 13 is covered with the metal layer TMt. This configuration allows the metal layer TMt to block the light path of the light propagating toward the switching element Tr1, and reduce light leakage of the switching element Tr1.

As illustrated in FIG. 22, the array substrate 10 includes the third insulating layer 13 serving as the organic insulating layer that covers at least the switching element Tr1, and the metal layer TM that is provided above the third insulating layer 13 so as to overlap the third insulating layer 13 and has a larger area than that of the switching element Tr1. Each of the regions surrounded by the scanning lines GL and the signal lines SL has a region having a thickness less than that of the third insulating layer 13 overlapping the scanning lines GL and the signal lines SL in the plan view. As a result, the metal layer TMt covers the first slant surface 13t1 of the third insulating layer 13 overlapping the switching element Tr1, the first slant surface 13t1 being a slant surface that is located, in the plan view, on a side of the third insulating layer 13 closer to the light source 3 than the switching element Tr1 is, and along which the thickness of the third insulating layer 13 changes. The metal layer TMt is a tapered portion that is made of the same material as that of the metal layer TM, and is formed by extending the metal layer TM.

As illustrated in FIG. 22, the metal layer TMt covers a second slant surface 13t2 of the third insulating layer 13 overlapping the switching element Tr1, the second slant surface 13t2 being a slant surface that is located, in the plan view, on a side of the third insulating layer 13 farther from the light source 3 than the switching element Tr1 is, and along which the thickness of the third insulating layer 13 changes. This configuration reduces light leakage.

The light-blocking structure SGS is covered with the third insulating layer 13, the metal layer TM, and the metal layer TMt. With this configuration, the light-blocking structure SGS blocks the light Lu that has passed through the metal layer TMt.

In this manner, the light-blocking structure SGS is located between the first slant surface 13t1 and the switching element Tr1. As a result, the metal layer TMt and the light-blocking structure SGS make the light Lu difficult to reach the switching element Tr1.

Modification

While the first to the third embodiments have been described on the assumption that the switching element Tr has a bottom-gate structure, the switching element Tr is not limited to the bottom-gate structure, and may have a top-gate structure, as described above. If the switching element Tr has the top-gate structure, referring to the insulating film stacking structure of FIG. 15, the structure is such that the semiconductor layer SC is disposed between the first light-transmitting base 19 and the first insulating layer 11, the gate electrode GE is disposed between the first insulating layer 11 and the second insulating layer 12, and the source electrode SE and the contact electrode DEA are formed between the second insulating layer 12 and the third insulating layer 13.

In addition, a direct-current voltage may be supplied as the common potential. In other words, the common potential may be constant. Alternatively, an alternating-current voltage may be shared as the common potential. In other words, the common potential may have two values of an upper limit value and a lower limit value. Whether the common potential is a direct-current potential or an alternating-current potential, the common potential is supplied to the holding capacitance electrode IO and the common electrode CE.

As the third insulating layer 13 serving as a grid-shaped organic insulating film, the structure is disclosed in which the third insulating layer 13 inside the grid-shaped region is completely removed, and the second insulating layer 12 and the holding capacitance electrode IO in the lower layers are exposed. However, the present disclosure is not limited to this structure. For example, the structure may be such that the third insulating layer 13 partially has a thin film remaining in a portion inside the grid-shaped region surrounded by the signal lines SL and the scanning lines GL using a halftone exposure technique. With this structure, the film thickness of the third insulating layer 13 inside the grid-shaped region is less than the film thickness of the grid-shaped region surrounded by the signal lines SL and the scanning lines GL.

While the preferred embodiments have been described above, the present disclosure is not limited to such embodiments. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure.

What is claimed is:

1. A display device comprising:
   an array substrate;
   a counter substrate;
   a liquid crystal layer between the array substrate and the counter substrate; and
   a light source disposed so as to emit light to a side surface of the array substrate or a side surface of the counter substrate, wherein the array substrate comprises:
- a plurality of signal lines arranged with spaces in a first direction;
- a plurality of scanning lines arranged with spaces in a second direction;
- switching elements coupled to the scanning lines and the signal lines;
- an organic insulating layer that covers at least the switching elements; and
- a metal layer provided above the organic insulating layer so as to overlap the organic insulating layer, wherein each of regions surrounded by the scanning lines and the signal lines has a region having a thickness less than that of the organic insulating layer overlapping the scanning lines and the signal lines in a plan view, wherein the metal layer covers a first slant surface of the organic insulating layer, the first slant surface being located on a side of the organic insulating layer closer to the light source than the switching element is, and wherein the metal layer covers a second slant surface of the organic insulating layer, the second slant surface being located on a side of the organic insulating layer farther from the light source than the switching element is.

2. The display device according to claim 1,
wherein the metal layer overlaps the signal lines and the scanning lines and is disposed in a grid shape above the organic insulating layer, in the plan view.

3. The display device according to claim 2,
wherein, in the plan view, a width of the metal layer overlapping the signal line is greater than a width of the signal line, and a width of the metal layer overlapping each of the scanning line is greater than a width of the scanning line.

4. The display device according to claim 1,
wherein the array substrate comprises a plurality of first light-transmitting electrodes each of which is disposed in a corresponding one of pixels, wherein the counter substrate comprises a second light-transmitting electrode overlapping the first light-transmitting electrodes, and wherein the array substrate further comprises, in the pixels, a third light-transmitting electrode that at least partially overlaps the first light-transmitting electrodes in the plan view with an inorganic insulating layer interposed between the third light-transmitting electrode and the first light-transmitting electrode, and wherein the metal layer is stacked on the third light-transmitting electrode.

5. The display device according to claim 1,
wherein a light-blocking structure is provided between the first slant surface and the switching element.

6. The display device according to claim 5,
wherein the light-blocking structure is formed such that the same conductive material as that of the scanning lines and the same conductive material as that of the signal lines are stacked.

7. The display device according to claim 5,
wherein two of the signal lines are arranged between two of the pixels adjacent in the first direction, and the light-blocking structure is provided on an extension line of each of the signal lines.

8. The display device according to claim 5,
wherein the light-blocking structure is covered with the organic insulating layer and the metal layer.

9. The display device according to claim 1,
wherein a length of a semiconductor layer of each of the switching elements in a direction intersecting a direction of incidence of light emitted from the light source is less than a length of the semiconductor layer of the switching element in the direction of incidence.

10. The display device according to claim 1,
wherein the liquid crystal layer is formed of polymer-dispersed liquid crystals, and wherein a background of the counter substrate is visible from the array substrate, and a background of the array substrate is visible from the counter substrate.

* * * * *